(12) United States Patent
Seo et al.

(10) Patent No.: US 9,627,650 B2
(45) Date of Patent: Apr. 18, 2017

(54) MULTIPLE LIGHT-EMITTING ELEMENT DEVICE EACH WITH VARYING WAVELENGTH

(71) Applicant: Semiconductor Energy Laboratory Co., Ltd., Kanagawa-ken (JP)

(72) Inventors: Satoshi Seo, Kanagawa (JP); Toshiki Sasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/920,335

(22) Filed: Oct. 22, 2015

(65) Prior Publication Data
US 2016/0118626 A1 Apr. 28, 2016

(30) Foreign Application Priority Data
Oct. 24, 2014 (JP) .................................. 2014-216875

(51) Int. Cl.
*H01L 51/52* (2006.01)
*H01L 27/32* (2006.01)

(52) U.S. Cl.
CPC ...... *H01L 51/5265* (2013.01); *H01L 27/3206* (2013.01); *H01L 27/3209* (2013.01); *H01L 27/322* (2013.01); *H01L 27/323* (2013.01); *H01L 27/3213* (2013.01); *H01L 27/3246* (2013.01); *H01L 51/524* (2013.01); *H01L 51/5218* (2013.01); *H01L 51/5234* (2013.01); *H01L 51/5246* (2013.01); *H01L 51/5278* (2013.01); *H01L 2251/5376* (2013.01)

(58) Field of Classification Search
CPC ............. H01L 51/5265; H01L 27/3206; H01L 27/3209
See application file for complete search history.

(56) References Cited

U.S. PATENT DOCUMENTS 5,892,787 A * 4/1999 Tan ..................... H01L 33/0016
257/E33.047
6,191,764 B1 * 2/2001 Kono ................... G09G 3/2025
313/504

(Continued)

FOREIGN PATENT DOCUMENTS

JP 2012-182127 9/2012

*Primary Examiner* — Ida M Soward
(74) *Attorney, Agent, or Firm* — Husch Blackwell LLP

(57) ABSTRACT

To provide a novel light-emitting device, a light-emitting device that emits light of a plurality of colors includes a first light-emitting element and a second light-emitting element. The first light-emitting element includes a first lower electrode, a first light-emitting layer over the first lower electrode, a second light-emitting layer over the first light-emitting layer, and an upper electrode over the second light-emitting layer. The second light-emitting element includes a second lower electrode, the first light-emitting layer over the second lower electrode, the second light-emitting layer over the first light-emitting layer, and the upper electrode over the second light-emitting layer. An emission spectrum of the first light-emitting layer peaks at a longer wavelength than an emission spectrum of the second light-emitting layer. A distance between the first lower electrode and the first light-emitting layer is shorter than a distance between the second lower electrode and the first light-emitting layer.

16 Claims, 29 Drawing Sheets

(56) References Cited

U.S. PATENT DOCUMENTS

| | | | |
|---|---|---|---|
| 6,281,634 B1 | 8/2001 | Yokoyama | |
| 6,822,393 B2 * | 11/2004 | Kim | H01J 11/12 313/473 |
| 7,091,668 B2 * | 8/2006 | Yahagi | G09G 3/2022 313/584 |
| 7,129,912 B2 * | 10/2006 | Otani | G09G 3/2022 345/208 |
| 7,196,391 B2 * | 3/2007 | Hsieh | H01L 27/14609 257/291 |
| 8,789,968 B2 * | 7/2014 | Ohsawa | H01L 51/5265 257/88 |
| 8,946,722 B2 * | 2/2015 | Kim | H01L 27/3213 257/40 |
| 9,172,059 B2 * | 10/2015 | Seo | H01L 27/3211 |
| 9,287,332 B2 * | 3/2016 | Hatano | H01L 51/504 |
| 9,331,100 B2 * | 5/2016 | Yamazaki | H01L 27/1225 |
| 9,379,345 B2 * | 6/2016 | Seo | H01L 51/504 |
| 2006/0022902 A1 * | 2/2006 | Sakai | G09G 3/2022 345/60 |
| 2007/0035243 A1 | 2/2007 | Lee | |
| 2007/0176161 A1 | 8/2007 | Seo et al. | |
| 2010/0231484 A1 | 9/2010 | Cok et al. | |
| 2012/0205676 A1 | 8/2012 | Seo et al. | |
| 2012/0205685 A1 | 8/2012 | Seo et al. | |
| 2012/0205686 A1 | 8/2012 | Seo et al. | |
| 2012/0206675 A1 * | 8/2012 | Seo | H01L 27/3211 349/96 |
| 2012/0243219 A1 | 9/2012 | Ohsawa et al. | |
| 2013/0140533 A1 * | 6/2013 | Lee | H01L 51/5265 257/40 |
| 2013/0264549 A1 | 10/2013 | Yamazaki et al. | |
| 2013/0265320 A1 | 10/2013 | Yamazaki et al. | |
| 2014/0117339 A1 | 5/2014 | Seo | |
| 2014/0134771 A1 | 5/2014 | Noda et al. | |
| 2014/0225102 A1 | 8/2014 | Ikeda et al. | |
| 2014/0284575 A1 | 9/2014 | Sugisawa et al. | |
| 2014/0284576 A1 | 9/2014 | Sugisawa et al. | |
| 2014/0291643 A1 * | 10/2014 | Ogita | H01L 51/0074 257/40 |
| 2014/0319492 A1 * | 10/2014 | Seo | H01L 51/0072 257/40 |
| 2015/0311250 A1 | 10/2015 | Seo et al. | |
| 2015/0333229 A1 | 11/2015 | Seo et al. | |
| 2016/0093678 A1 | 3/2016 | Seo et al. | |
| 2016/0126500 A1 | 5/2016 | Uesaka et al. | |
| 2016/0197299 A1 * | 7/2016 | Suzuki | H01L 51/5056 257/40 |

* cited by examiner

MULTIPLE LIGHT-EMITTING ELEMENT DEVICE EACH WITH VARYING WAVELENGTH

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a light-emitting device, an electronic device, and a lighting device each including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a driving method thereof, and a manufacturing method thereof.

2. Description of the Related Art

In recent years, research and development have been extensively conducted on light-emitting elements utilizing electroluminescence (EL). In a basic structure of these light-emitting elements, a layer containing a light-emitting substance is provided between a pair of electrodes. By application of a voltage to this element, light emitted from the light-emitting substance can be obtained.

Since the above light-emitting element is a self-luminous type, a light-emitting device using this light-emitting element has advantages such as high visibility, no necessity of a backlight, and low power consumption. The light-emitting device using the light-emitting element also has advantages in that it can be manufactured to be thin and lightweight and has high response speed.

In order to improve the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

REFERENCE

Patent Document

[Patent Document 1] Japanese Published Patent Application No. 2012-182127

SUMMARY OF THE INVENTION

When a metal film with high reflectance (e.g., a metal film containing silver) is used as one of a pair of electrodes in a micro optical resonator structure (hereinafter referred to as a microcavity structure) utilizing a resonant effect of light between the pair of electrodes, light might be scattered or absorbed in the vicinity of a surface of the metal film with high reflectance under the influence of surface plasmon resonance (SPR), resulting in lower light extraction efficiency.

In view of the above problems, an object of one embodiment of the present invention is to provide a novel light-emitting device. Another object is to provide a novel light-emitting device with high emission efficiency and low power consumption. Another object is to provide a method for manufacturing the novel light-emitting device.

Note that the description of the above objects does not disturb the existence of other objects. In one embodiment of the present invention, there is no need to achieve all the objects. Other objects will be apparent and can be derived from the description of the specification and the like.

One embodiment of the present invention is a light-emitting device that emits light of a plurality of colors. The light-emitting device includes a first light-emitting element and a second light-emitting element. The first light-emitting element includes a first lower electrode, a first light-emitting layer over the first lower electrode, a second light-emitting layer over the first light-emitting layer, and an upper electrode over the second light-emitting layer. The second light-emitting element includes a second lower electrode, the first light-emitting layer over the second lower electrode, the second light-emitting layer over the first light-emitting layer, and the upper electrode over the second light-emitting layer. An emission spectrum of the first light-emitting layer peaks at a longer wavelength than an emission spectrum of the second light-emitting layer. A distance between the first lower electrode and the first light-emitting layer is shorter than a distance between the second lower electrode and the first light-emitting layer.

Another embodiment of the present invention is a light-emitting device that emits light of a plurality of colors. The light-emitting device includes a first light-emitting element and a second light-emitting element. The first light-emitting element includes a first lower electrode, a first light-emitting layer over the first lower electrode, a second light-emitting layer over the first light-emitting layer, and an upper electrode over the second light-emitting layer. The second light-emitting element includes a second lower electrode, the first light-emitting layer over the second lower electrode, the second light-emitting layer over the first light-emitting layer, and the upper electrode over the second light-emitting layer. A spectrum of light emitted from the first light-emitting layer has a peak of any one of green, yellow green, yellow, orange, and red. A spectrum of light emitted from the second light-emitting layer has a peak of any one of violet, blue, and blue green. A distance between the first lower electrode and the first light-emitting layer is shorter than a distance between the second lower electrode and the first light-emitting layer.

In either of the above embodiments, it is preferable that light emitted from the first light-emitting element have at least one peak in a blue wavelength range and light emitted from the second light-emitting element have at least one peak in a yellow wavelength range. Moreover, in either of the above embodiments, it is preferable that an optical path length between the first lower electrode and the second light-emitting layer be approximately $3\lambda_B/4$ ($\lambda_B$ represents a wavelength of blue light) and an optical path length between the second lower electrode and the first light-emitting layer be approximately $3\lambda_Y/4$ ($\lambda_Y$ represents a wavelength of yellow light). Note that in this specification and the like, approximately $3\lambda_X/4$ ($\lambda_X$ represents any one of $\lambda_R$, $\lambda_G$, $\lambda_B$, and $\lambda_Y$) is within the range of ±20 nm of $3\lambda_X/4$, preferably ±10 nm of $3\lambda_X/4$.

In either of the above embodiments, the first lower electrode and the second lower electrode each preferably include silver.

Another embodiment of the present invention is a light-emitting device that emits light of a plurality of colors. The light-emitting device includes a first light-emitting element, a second light-emitting element, and a third light-emitting element. The first light-emitting element includes a first lower electrode, a first transparent conductive layer over the first lower electrode, a first light-emitting layer over the first transparent conductive layer, a charge-generation layer over the first light-emitting layer, a second light-emitting layer over the charge-generation layer, and an upper electrode over the second light-emitting layer. The second light-emitting element includes a second lower electrode, a second transparent conductive layer over the second lower electrode, the first light-emitting layer over the second transparent conductive layer, the charge-generation layer over the first light-emitting layer, the second light-emitting layer over the charge-generation layer, and the upper electrode over the second light-emitting layer. The third light-emitting element includes a third lower electrode, a third transparent conductive layer over the third lower electrode, the first light-emitting layer over the third transparent conductive layer, the charge-generation layer over the first light-emitting layer, the second light-emitting layer over the charge-generation layer, and the upper electrode over the second light-emitting layer. Light emitted from the first light-emitting element has at least one peak in a wavelength range of greater than or equal to 400 nm and less than 480 mm Light emitted from the second light-emitting element has at least one peak in a wavelength range of greater than or equal to 480 nm and less than 600 nm. Light emitted from the third light-emitting element has at least one peak in a wavelength range of greater than or equal to 600 nm and less than or equal to 740 nm.

Another embodiment of the present invention is a light-emitting device that emits light of a plurality of colors. The light-emitting device includes a first light-emitting element, a second light-emitting element, a third light-emitting element, and a fourth light-emitting element. The first light-emitting element includes a first lower electrode, a first transparent conductive layer over the first lower electrode, a first light-emitting layer over the first transparent conductive layer, a charge-generation layer over the first light-emitting layer, a second light-emitting layer over the charge-generation layer, and an upper electrode over the second light-emitting layer. The second light-emitting element includes a second lower electrode, a second transparent conductive layer over the second lower electrode, the first light-emitting layer over the second transparent conductive layer, the charge-generation layer over the first light-emitting layer, the second light-emitting layer over the charge-generation layer, and the upper electrode over the second light-emitting layer. The third light-emitting element includes a third lower electrode, a third transparent conductive layer over the third lower electrode, the first light-emitting layer over the third transparent conductive layer, the charge-generation layer over the first light-emitting layer, the second light-emitting layer over the charge-generation layer, and the upper electrode over the second light-emitting layer. The fourth light-emitting element includes a fourth lower electrode, a fourth transparent conductive layer over the fourth lower electrode, the first light-emitting layer over the fourth transparent conductive layer, the charge-generation layer over the first light-emitting layer, the second light-emitting layer over the charge-generation layer, and the upper electrode over the second light-emitting layer. Light emitted from the first light-emitting element has at least one peak in a wavelength range of greater than or equal to 400 nm and less than 480 nm Light emitted from the second light-emitting element has at least one peak in a wavelength range of greater than or equal to 550 nm and less than 600 nm. Light emitted from the third light-emitting element has at least one peak in a wavelength range of greater than or equal to 600 nm and less than or equal to 740 nm. Light emitted from the fourth light-emitting element has at least one peak in a wavelength range of greater than or equal to 480 nm and less than 550 nm.

In any of the above embodiments, it is preferable that the first light-emitting layer includes a phosphorescent material and the second light-emitting layer includes a fluorescent material.

One embodiment of the present invention includes, in its scope, an electronic device including the light-emitting device in each of the above embodiments and having a housing or a touch sensor or a lighting device including the light-emitting device in each of the above embodiments and a housing. Note that a light-emitting device in this specification refers to an image display device or a light source (including a lighting device). Furthermore, a light-emitting device might include, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

According to one embodiment of the present invention, a novel light-emitting device can be provided. According to another embodiment of the present invention, a novel light-emitting device with high emission efficiency and low power consumption can be provided. According to another embodiment of the present invention, a method for manufacturing the novel light-emitting device can be provided.

Note that the description of these effects does not disturb the existence of other effects. One embodiment of the present invention does not necessarily achieve all the effects listed above. Other effects will be apparent and can be derived from the description of the specification, the drawings, the claims, and the like.

DETAILED DESCRIPTION OF THE INVENTION

Figure 1:
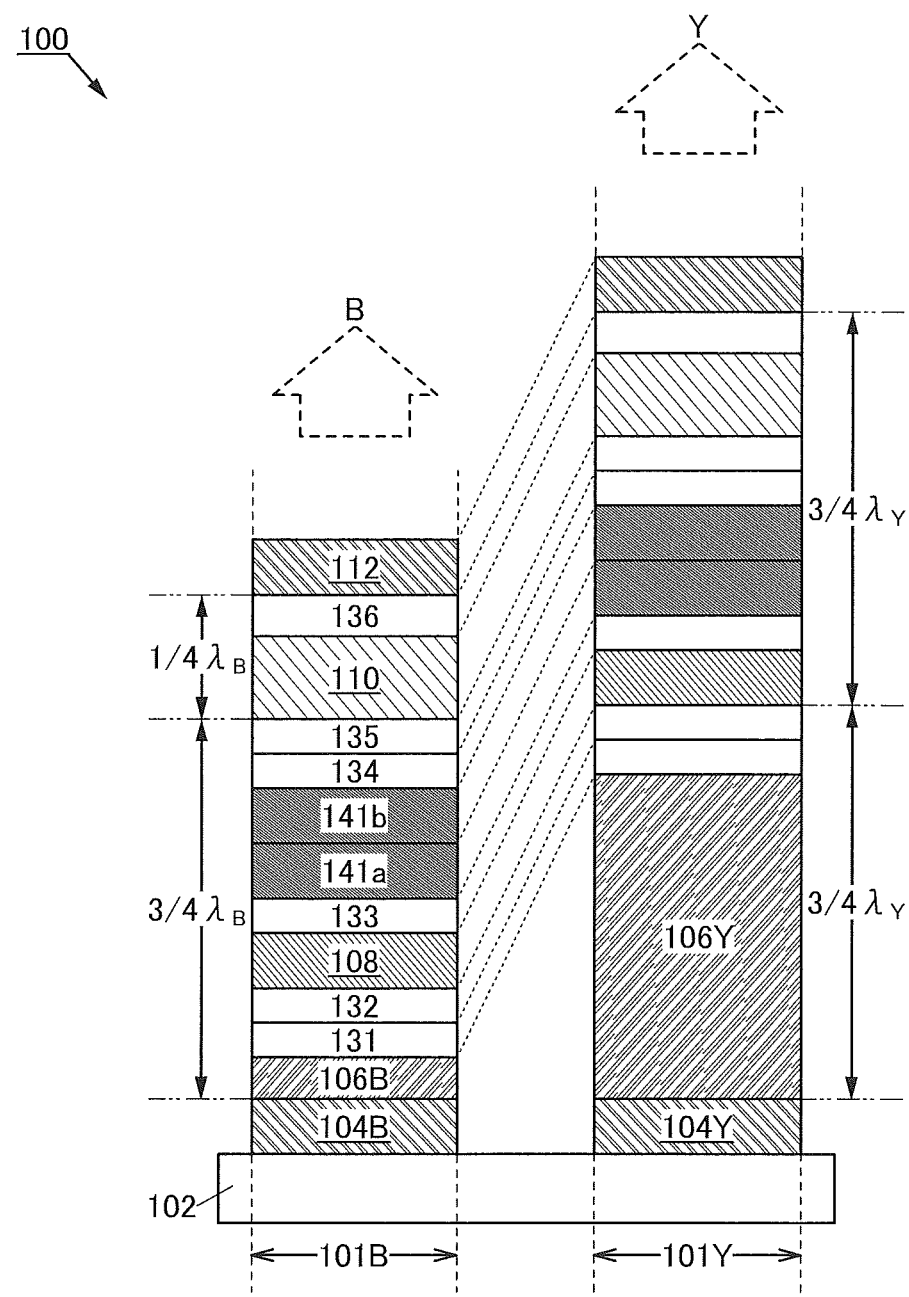
FIG. 1 is a cross-sectional view illustrating a light-emitting device.

Embodiments of the present invention will be described in detail below with reference to the drawings. Note that one embodiment of the present invention is not limited to the following description, and the modes and details thereof can be modified in various ways without departing from the spirit and scope of the present invention. Accordingly, one embodiment of the present invention should not be interpreted as being limited to the content of the embodiments below.

Note that the position, the size, the range, or the like of each structure illustrated in drawings and the like is not accurately represented in some cases for easy understanding. Therefore, one embodiment of the disclosed invention is not necessarily limited to the position, the size, the range, or the like disclosed in the drawings and the like.

The ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In order to describe structures of the invention with reference to the drawings in this specification and the like, the same reference numerals are used in common for the same portions in different drawings.

In this specification and the like, the wavelength range of blue light is greater than or equal to 400 nm and less than 480 nm, the wavelength range of green light is greater than or equal to 480 nm and less than 550 nm, the wavelength range of yellow light is greater than or equal to 550 nm and less than 600 nm, and the wavelength range of red light is greater than or equal to 600 nm and less than or equal to 740 nm.

In this specification and the like, a transparent conductive layer transmits visible light and has conductivity. Examples of the transparent conductive layer include an oxide conductor film typified by an indium tin oxide (ITO) film, an oxide semiconductor film, an organic conductive film containing an organic substance, and the like. Examples of the organic conductive film containing an organic substance include a film containing a composite material in which an organic compound and an electron donor (donor) are mixed, a film containing a composite material in which an organic compound and an electron acceptor (acceptor) are mixed, and the like. The resistivity of the transparent conductive layer is preferably lower than or equal to $1\times10^5$ Ω·cm and further preferably lower than or equal to $1\times10^4$ Ω·cm.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

(Embodiment 1)

In this embodiment, a light-emitting device of one embodiment of the present invention and a method for manufacturing the light-emitting device will be described below with reference to FIGS. 1 to 13, FIGS. 14A and 14B, FIGS. 15A and 15B, and FIGS. 16A and 16B.

<Structural Example 1 of Light-Emitting Device>

FIG. 1 is a cross-sectional view illustrating an example of a light-emitting device of one embodiment of the present invention. A light-emitting device 100 illustrated in FIG. 1 includes a first light-emitting element 101B and a second light-emitting element 101Y. The first light-emitting element 101B includes a first lower electrode 104B, a first light-emitting layer 108 over the first lower electrode 104B, a second light-emitting layer 110 over the first light-emitting layer 108, and an upper electrode 112 over the second light-emitting layer 110. The second light-emitting element 101Y includes a second lower electrode 104Y, the first light-emitting layer 108 over the second lower electrode 104Y, the second light-emitting layer 110 over the first light-emitting layer 108, and the upper electrode 112 over the second light-emitting layer 110. The emission spectrum of the first light-emitting layer 108 peaks at a longer wavelength than that of the second light-emitting layer 110, and the distance between the first lower electrode 104B and the first light-emitting layer 108 is shorter than the distance between the second lower electrode 104Y and the first light-emitting layer 108.

The first light-emitting element 101B further includes a first transparent conductive layer 106B, a hole-injection layer 131, a hole-transport layer 132, an electron-transport layer 133, charge-generation layers 141a and 141b, a hole-injection layer 134, a hole-transport layer 135, and an electron-transport layer 136. Note that in the first light-emitting element 101B, the first transparent conductive layer 106B, the hole-injection layer 131, and the hole-transport layer 132 are provided between the first lower electrode 104B and the first light-emitting layer 108.

The second light-emitting element 101Y further includes a second transparent conductive layer 106Y, the hole-injection layer 131, the hole-transport layer 132, the electron-transport layer 133, the charge-generation layers 141a and 141b, the hole-injection layer 134, the hole-transport layer 135, and the electron-transport layer 136. Note that in the second light-emitting element 101Y, the second transparent conductive layer 106Y, the hole-injection layer 131, and the hole-transport layer 132 are provided between the second lower electrode 104Y and the first light-emitting layer 108.

In each of the first light-emitting element 101B and the second light-emitting element 101Y, the electron-transport layer 133, the charge-generation layers 141a and 141b, the hole-injection layer 134, and the hole-transport layer 135 are provided between the first light-emitting layer 108 and the second light-emitting layer 110. The electron-transport layer 136 is provided between the second light-emitting layer 110 and the upper electrode 112.

A spectrum of light emitted from the first light-emitting layer 108 has a peak of any one of green, yellow green, yellow, orange, and red. In other words, the first light-emitting layer 108 includes a light-emitting substance that emits light of any one of green, yellow green, yellow, orange, and red. A spectrum of light emitted from the second light-emitting layer 110 has a peak of any one of violet, blue, and blue green. In other words, the second light-emitting layer 110 includes a light-emitting substance that emits light of any one of violet, blue, and blue green.

For example, the first light-emitting layer 108 can be formed using a phosphorescent material emitting yellow light as a light-emitting substance, and the second light-emitting layer 110 can be formed using a fluorescent material emitting blue light as a light-emitting substance.

Figure 6:
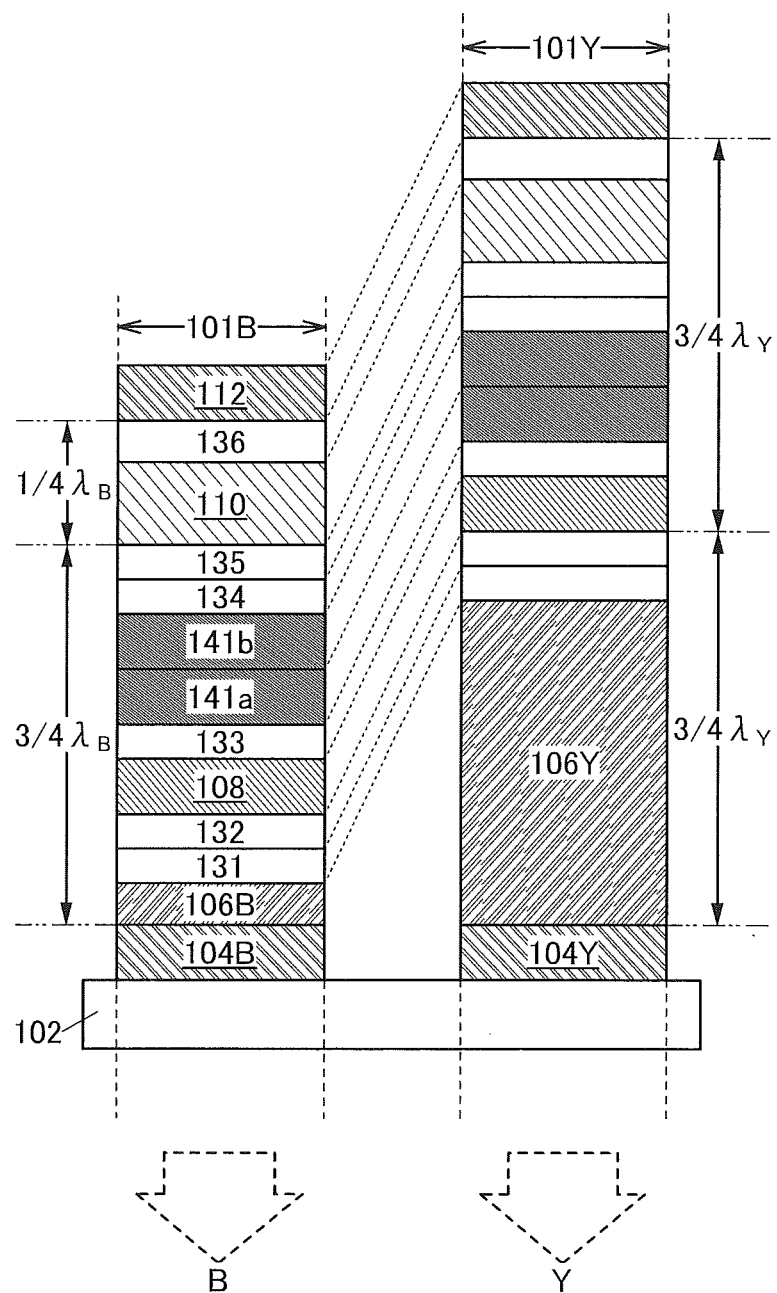
FIG. 6 is a cross-sectional view illustrating a light-emitting device.

In FIG. 1, blue light (B) and yellow light (Y) emitted from their respective light-emitting elements are schematically denoted by arrows of dashed lines. The light-emitting device 100 illustrated in FIG. 1 has a top-emission structure in which light emitted from light-emitting elements is extracted to the side opposite to the substrate 102 side where the light-emitting elements are formed. However, one embodiment of the present invention is not limited thereto and may have a bottom-emission structure in which light emitted from light-emitting elements is extracted to the substrate side where the light-emitting elements are formed, or a dual-emission structure in which light emitted from light-emitting elements is extracted in both top and bottom directions of the substrate 102 where the light-emitting elements are formed. FIG. 6 illustrates an example of the bottom-emission light-emitting device. FIG. 6 is a cross-sectional view in the case where the light-emitting device 100 illustrated in FIG. 1 is a bottom-emission light-emitting device.

Note that in an example shown in FIG. 1, the hole-injection layer 131, the hole-transport layer 132, the first light-emitting layer 108, the electron-transport layer 133, the charge-generation layers 141a and 141b, the hole-injection layer 134, the hole-transport layer 135, the second light-emitting layer 110, and the electron-transport layer 136 are each divided to form the first light-emitting element 101B and the second light-emitting element 101Y; however, they can also be used without being divided. Therefore, in the second light-emitting element 101Y, the hole-injection layer 131, the hole-transport layer 132, the first light-emitting layer 108, the electron-transport layer 133, the charge-generation layers 141a and 141b, the hole-injection layer 134, the hole-transport layer 135, the second light-emitting layer 110, and the electron-transport layer 136 are represented by the same hatching patterns as in the first light-emitting element 101B and not especially denoted by reference numerals.

The first light-emitting element 101B and the second light-emitting element 101Y each have a microcavity structure. The microcavity structure of each light-emitting element is described below.

Light emitted from the first light-emitting layer 108 and the second light-emitting layer 110 resonates between two pairs of electrodes (a pair of the first lower electrode 104B and the upper electrode 112, and a pair of the second lower electrode 104Y and the upper electrode 112). In the light-emitting device 100, the thickness of each of the first transparent conductive layer 106B and the second transparent conductive layer 106Y in the light-emitting elements is adjusted so that desired wavelengths of light emitted from the first light-emitting layer 108 and light emitted from the second light-emitting layer 110 can be intensified.

Specifically, the thickness of the first transparent conductive layer 106B is adjusted so that the optical path length between the first lower electrode 104B and the upper electrode 112 can be $m\lambda_B/2$ (m is a natural number and $\lambda_B$ is a wavelength of blue light). Note that in FIG. 1, the thickness of the first transparent conductive layer 106B is adjusted so that the optical path length between the first lower electrode 104B and the upper electrode 112 can be $\lambda_B$. The thickness of the second transparent conductive layer 106Y is adjusted so that the optical path length between the second lower electrode 104Y and the upper electrode 112 can be $m\lambda_Y/2$ an is a natural number and $\lambda_Y$ is a wavelength of yellow light). Note that in FIG. 1, the thickness of the second transparent conductive layer 106Y is adjusted so that the optical path length between the second lower electrode 104Y and the upper electrode 112 can be $3\lambda_Y/2$.

Note that in the light-emitting device 100 illustrated in FIG. 1, the structure is described as an example in which the distance between each of the lower electrodes and the first light-emitting layer 108 is differentiated by the thickness of the transparent conductive layers (the first transparent conductive layer 106B and the second transparent conductive layer 106Y). However, without limitation thereto, the distance between the lower electrode and the first light-emitting layer 108 may be differentiated by the thickness of one or both of the hole-injection layer 131 and the hole-transport layer 132. However, as shown in the light-emitting device 100 illustrated in FIG. 1, it is preferable to differentiate the distance between the lower electrode and the first light-emitting layer 108 by changing the thickness of the transparent conductive layer because the hole-injection layer 131 and the hole-transport layer 132 can be shared by the first light-emitting element 101B and the second light-emitting element 101Y.

By adjusting the thickness of the first transparent conductive layer 106B, the optical path length between the first lower electrode 104B and the second light-emitting layer 110 can be set to $3\lambda_B/4$ ($\lambda_B$ represents a wavelength of blue light). Furthermore, by adjusting the thickness of the first transparent conductive layer 106B, the optical path length between the hole-transport layer 135 and the upper electrode 112 can be set to $\lambda_B/4$. Note that here, the optical path length between the hole-transport layer 135 and the upper electrode 112 is set to $\lambda_B/4$ because a light-emitting region in the second light-emitting layer 110 is located in the vicinity of the interface between the hole-transport layer 135 and the second light-emitting layer 110; however, to be exact, the optical path length between the light-emitting region in the second light-emitting layer 110 and the upper electrode 112 is preferred to be set to $\lambda_B/4$.

For example, in the case where the distance between the first lower electrode 104B and the second light-emitting layer 110 is short, specifically, in the case where the optical path length between the first lower electrode 104B and the second light-emitting layer 110 is $\lambda_B/4$, in some cases, light emitted from the second light-emitting layer 110 attenuates owing to scattering or absorption in the vicinity of the surface of the first lower electrode 104B, resulting in a decrease in light extraction efficiency. However, in the light-emitting device 100, the optical path length between the first lower electrode 104B and the second light-emitting layer 110 is set to $3\lambda_B/4$, whereby scattering or absorption of light in the vicinity of the first lower electrode 104B can be suppressed and thus the efficiency of extraction of light from the second light-emitting layer 110 can be improved. Accordingly, in the first light-emitting element 101B, blue light can be efficiently extracted from the light-emitting substance included in the second light-emitting layer 110.

By adjusting the thickness of the second transparent conductive layer 106Y, the optical path length between the second lower electrode 104Y and the first light-emitting layer 108 can be set to $3\lambda_Y/4$ ($\lambda_Y$ represents a wavelength of yellow light). Furthermore, by adjusting the thickness of the second transparent conductive layer 106Y, the optical path length between the hole-transport layer 132 and the upper electrode 112 can be set to $3\lambda_Y/4$. Note that here, the optical path length between the hole-transport layer 132 and the upper electrode 112 is set to $3\lambda_Y/4$ because a light-emitting region in the first light-emitting layer 108 is located in the vicinity of the interface between the hole-transport layer 132 and the first light-emitting layer 108; however, to be exact, the optical path length between the light-emitting region in the first light-emitting layer 108 and the upper electrode 112 is preferred to be set to $3\lambda_Y/4$.

For example, in the case where the distance between the second lower electrode 104Y and the first light-emitting layer 108 is short, specifically, in the case where the optical path length between the second lower electrode 104Y and the first light-emitting layer 108 is $\lambda_Y/4$, in some cases, light emitted from the first light-emitting layer 108 attenuates owing to scattering or absorption in the vicinity of the surface of the second lower electrode 104Y, resulting in a decrease in light extraction efficiency. However, in the light-emitting device 100, the optical path length between the second lower electrode 104Y and the first light-emitting layer 108 is set to $3\lambda_Y/4$, whereby scattering or absorption of light in the vicinity of the second lower electrode 104Y can be suppressed and thus the efficiency of extraction of light from the first light-emitting layer 108 can be improved. Accordingly, in the second light-emitting element 101Y, yellow light can be efficiently extracted from the light-emitting substance included in the first light-emitting layer 108.

In some cases, there is difficulty in satisfying $3\lambda_Y/4$ as the optical path length between the first lower electrode 104B and the second light-emitting layer 110 in the first light-emitting element 101B and satisfying $\lambda_Y/4$ as the optical path length between the second lower electrode 104Y and the first light-emitting layer 108 in the second light-emitting element 101Y because the hole-injection layer 131, the hole-transport layer 132, the first light-emitting layer 108, the electron-transport layer 133, the charge-generation layers 141a and 141b, the hole-injection layer 134, the hole-transport layer 135, the second light-emitting layer 110, and the electron-transport layer 136 are shared by the first light-emitting element 101B and the second light-emitting element 101Y. For example, in the case where the optical path length between a pair of electrodes in the first light-emitting element 101B is set to $\lambda_B$, the total thickness of the second transparent conductive layer 106Y, the hole-injection layer 131, and the hole-transport layer 132 in the second light-emitting element 101Y needs to be made small (e.g., approximately 20 nm). However, since the optical path length between the second lower electrode 104Y and the first light-emitting layer 108 is set to $3\lambda_Y/4$ in the light-emitting device of one embodiment of the present invention, the total thickness of the second transparent conductive layer 106Y, the hole-injection layer 131, and the hole-transport layer 132 in the second light-emitting element 101Y can be made large.

Furthermore, the optical path length between the first lower electrode 104B and the second light-emitting layer 110 is, to be exact, the optical path length between a reflective region in the first lower electrode 104B and a light-emitting region in the second light-emitting layer 110. However, it is difficult to precisely determine the positions of the reflection region in the first lower electrode 104B and the light-emitting region in the second light-emitting layer 110; therefore, it is assumed that the above effect can be sufficiently obtained wherever the reflection region and the light-emitting region may be set in the first lower electrode 104B and the second light-emitting layer 110, respectively. The same applies to the optical path length between the second lower electrode 104Y and the first light-emitting layer 108.

By adjusting the above-described optical path lengths, the distance between the first lower electrode 104B and the first light-emitting layer 108 can be made shorter than the distance between the second lower electrode 104Y and the first light-emitting layer 108.

The first lower electrode 104B and the second lower electrode 104Y are each formed using a conductive material having a property of reflecting visible light. For example, a material containing silver may be used as the conductive material. When the first lower electrode 104B and the second lower electrode 104Y are each formed using a material containing silver, the reflectance can be increased and the emission efficiency of each light-emitting element can be increased. For example, a conductive film containing silver is formed and separated into an island-shape; in this way, the first lower electrode 104B and the second lower electrode 104Y can be formed. The first lower electrode 104B and the second lower electrode 104Y are preferably formed through a step of processing the same conductive film, because the manufacturing cost can be reduced.

As described above, in the light-emitting device 100 illustrated in FIG. 1, in the first light-emitting element 101B, light (e.g., blue light) emitted from the second light-emitting layer 110 is adjusted to be intensified; and in the second light-emitting element 101Y, light (e.g., yellow light) emitted from the first light-emitting layer 108 is adjusted to be intensified. White light can be obtained by combining light emitted from the first light-emitting element 101B and light emitted from the second light-emitting element 101Y.

As described above, in the light-emitting device 100 illustrated in FIG. 1, the optical path length between each of the lower electrodes (the first lower electrode 104B and the second lower electrode 104Y) and the upper electrode 112 of each light-emitting element is adjusted, whereby scattering or absorption of light in the vicinity of the lower electrode can be suppressed and thus high light extraction efficiency can be achieved. Therefore, a novel light-emitting device with high emission efficiency and low power consumption can be provided.

<Structural Example 2 of Light-Emitting Device>

Next, a structural example different from the light-emitting device 100 illustrated in FIG. 1 is described below with reference to FIG. 2.

Figure 2:
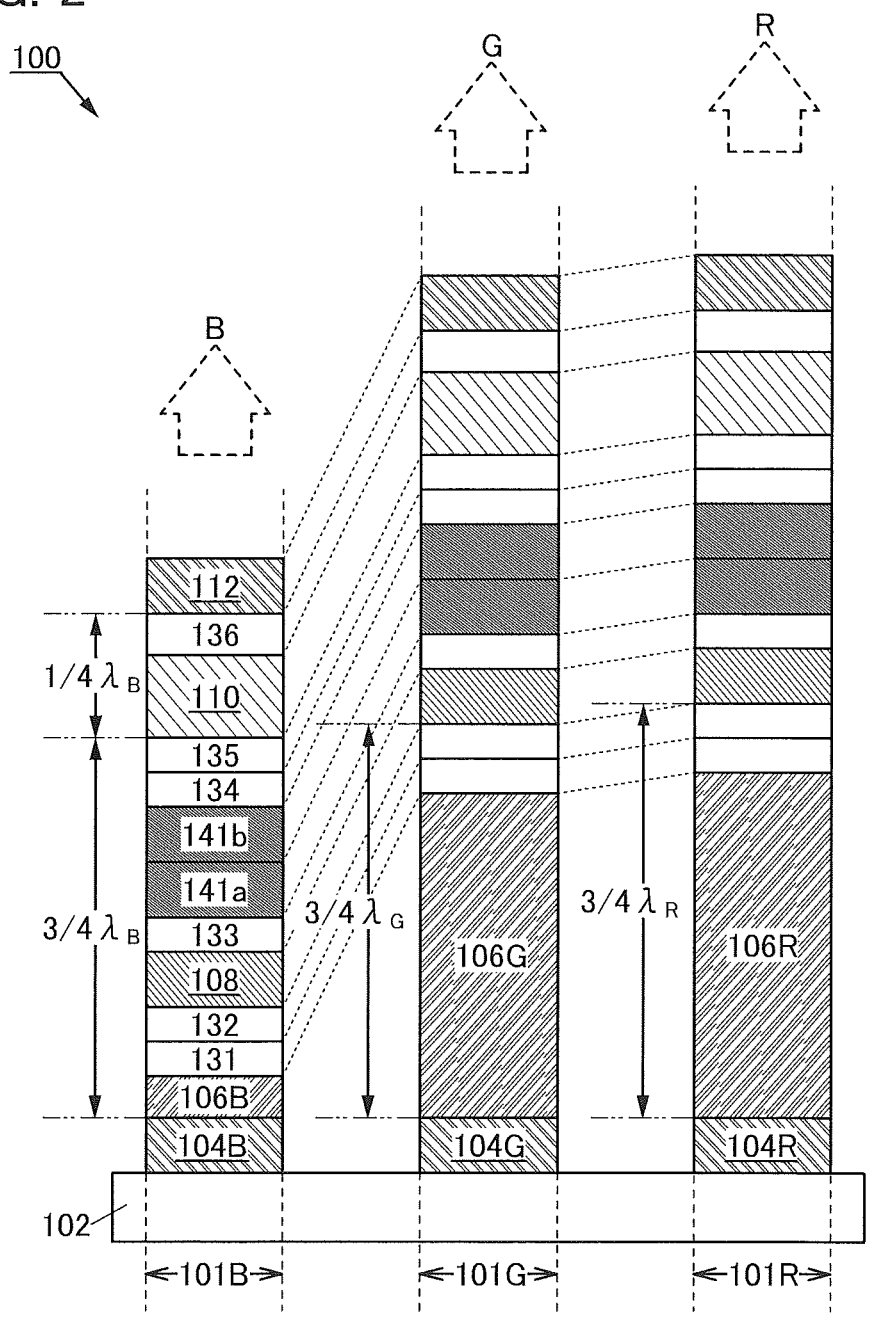
FIG. 2 is a cross-sectional view illustrating a light-emitting device.

FIG. 2 is a cross-sectional view illustrating an example of a light-emitting device of one embodiment of the present invention. In FIG. 2, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

The light-emitting device 100 illustrated in FIG. 2 includes the first light-emitting element 101B, a second light-emitting element 101G, and a third light-emitting element 101R. The first light-emitting element 101B includes the first lower electrode 104B, the first transparent conductive layer 106B over the first lower electrode 104B, the first light-emitting layer 108 over the first transparent conductive layer 106B, the charge-generation layers 141a and 141b over the first light-emitting layer 108, the second light-emitting layer 110 over the charge-generation layers 141a and 141b, and the upper electrode 112 over the second light-emitting layer 110. The second light-emitting element 101G includes a second lower electrode 104G, a second transparent conductive layer 106G over the second lower electrode 104G, the first light-emitting layer 108 over the second transparent conductive layer 106G, the charge-generation layers 141a and 141b over the first light-emitting layer 108, the second light-emitting layer 110 over the charge-generation layers 141a and 141b, and the upper electrode 112 over the second light-emitting layer 110. The third light-emitting element 101R includes a third lower electrode 104R, a third transparent conductive layer 106R over the third lower electrode 104R, the first light-emitting layer 108 over the third transparent conductive layer 106R, the charge-generation layers 141a and 141b over the first light-emitting layer 108, the second light-emitting layer 110 over the charge-generation layers 141a and 141b, and the upper electrode 112 over the second light-emitting layer 110.

The first light-emitting element 101B further includes the first transparent conductive layer 106B, the hole-injection layer 131, the hole-transport layer 132, the electron-transport layer 133, the hole-injection layer 134, the hole-transport layer 135, and the electron-transport layer 136. Note that in the first light-emitting element 101B, the first transparent conductive layer 106B, the hole-injection layer 131, and the hole-transport layer 132 are provided between the first lower electrode 104B and the first light-emitting layer 108.

The second light-emitting element 101G further includes the second transparent conductive layer 106G, the hole-injection layer 131, the hole-transport layer 132, the electron-transport layer 133, the hole-injection layer 134, the hole-transport layer 135, and the electron-transport layer 136. Note that in the second light-emitting element 101G, the second transparent conductive layer 106G, the hole-injection layer 131, and the hole-transport layer 132 are provided between the second lower electrode 104G and the first light-emitting layer 108.

The third light-emitting element 101R further includes the third transparent conductive layer 106R, the hole-injection layer 131, the hole-transport layer 132, the electron-transport layer 133, the hole-injection layer 134, the hole-transport layer 135, and the electron-transport layer 136. Note that in the third light-emitting element 101R, the third transparent conductive layer 106R, the hole-injection layer 131, and the hole-transport layer 132 are provided between the third lower electrode 104R and the first light-emitting layer 108.

In each of the first light-emitting element 101B, the second light-emitting element 101G, and the third light-emitting element 101R, the electron-transport layer 133, the charge-generation layers 141a and 141b, the hole-injection layer 134, and the hole-transport layer 135 are provided between the first light-emitting layer 108 and the second light-emitting layer 110. The electron-transport layer 136 is provided between the second light-emitting layer 110 and the upper electrode 112.

Light emitted from the first light-emitting element 101B has at least one peak in a wavelength range of greater than or equal to 400 nm and less than 480 nm, light emitted from the second light-emitting element 101G has at least one peak in a wavelength range of greater than or equal to 480 nm and less than 600 nm, and light emitted from the third light-emitting element 101R has at least one peak in a wavelength range of greater than or equal to 600 nm and less than or equal to 740 mm Note that it is preferable that light emitted from the second light-emitting element 101G is in a wavelength range of greater than or equal to 480 nm and less than 550 nm.

Light emitted from the first light-emitting layer 108 and the second light-emitting layer 110 resonates between three pairs of electrodes (a pair of the first lower electrode 104B and the upper electrode 112, a pair of the second lower electrode 104G and the upper electrode 112, and a pair of the third lower electrode 104R and the upper electrode 112). In the light-emitting device 100 illustrated in FIG. 2, the thickness of each of the first transparent conductive layer 106B, the second transparent conductive layer 106G, and the third transparent conductive layer 106R in the light-emitting elements is adjusted so that desired wavelengths of light emitted from the first light-emitting layer 108 and light emitted from the second light-emitting layer 110 can be intensified.

Specifically, the thickness of the first transparent conductive layer 106B is adjusted so that the optical path length between the first lower electrode 104B and the upper electrode 112 can be $m\lambda_B/2$ (m is a natural number and $\lambda_B$ is a wavelength of blue light). Note that in FIG. 2, the thickness of the first transparent conductive layer 106B is adjusted so that the optical path length between the first lower electrode 104B and the upper electrode 112 can be $\lambda_B$. The thickness of the second transparent conductive layer 106G is adjusted so that the optical path length between the second lower electrode 104G and the upper electrode 112 can be $m\lambda_G/2$ (m is a natural number and $\lambda_G$ is a wavelength of green light). Note that in FIG. 2, the thickness of the second transparent conductive layer 106G is adjusted so that the optical path length between the second lower electrode 104G and the upper electrode 112 can be $3\lambda_G/2$. The thickness of the third transparent conductive layer 106R is adjusted so that the optical path length between the third lower electrode 104R and the upper electrode 112 can be $m\lambda_R/2$ (m is a natural number and $\lambda_R$ is a wavelength of green light). Note that in FIG. 2, the thickness of the third transparent conductive layer 106R is adjusted so that the optical path length between the third lower electrode 104R and the upper electrode 112 can be $3\lambda_R/2$.

Note that the optical path length between the third lower electrode 104R and the upper electrode 112 is not limited to the above-described optical path lengths. For example, the optical path length in FIG. 3 can be obtained by adjusting the thickness of the third transparent conductive layer 106R.

Figure 3:
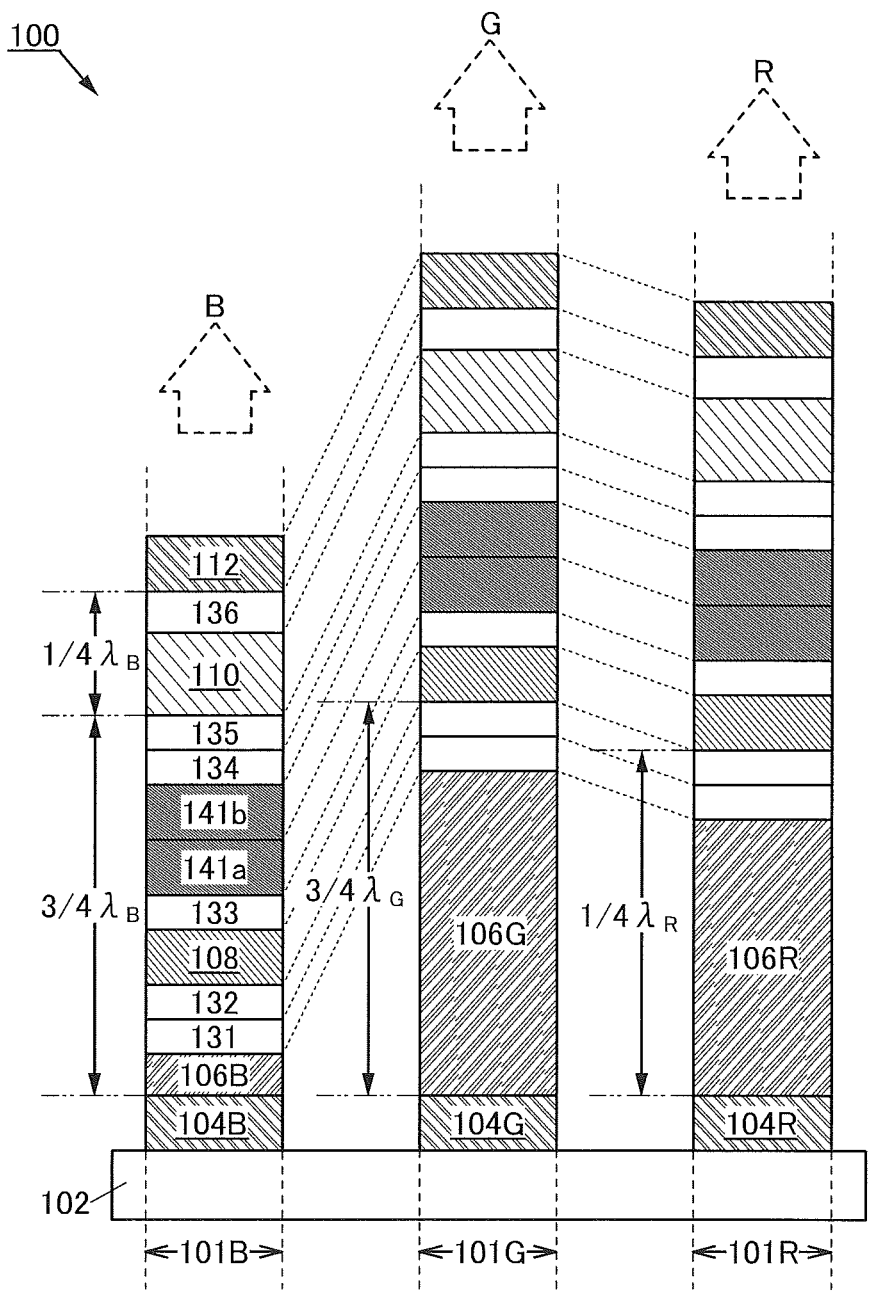
FIG. 3 is a cross-sectional view illustrating a light-emitting device.

FIG. 3 is a cross-sectional view illustrating an example of a light-emitting device of one embodiment of the present invention.

The light-emitting device 100 illustrated in FIG. 3 is the same as the light-emitting device 100 illustrated in FIG. 2 in the structures of the first light-emitting element 101B and the second light-emitting element 101G and is different therefrom in the optical path length between the third lower electrode 104R and the first light-emitting layer 108 in the third light-emitting element 101R. Specifically, by adjusting the thickness of the third transparent conductive layer 106R, the optical path length between the third lower electrode 104R and the first light-emitting layer 108 can be set to approximately $\lambda_R/4$ ($\lambda_R$ represents a wavelength of red light). By adjusting the thickness of the third transparent conductive layer 106R, the optical path length between the third lower electrode 104R and the upper electrode 112 can be set to approximately $\lambda_R$.

<Structural Example 3 of Light-Emitting Device>

Next, a structural example different from the light-emitting device 100 illustrated in FIG. 1 is described below with reference to FIG. 4.

Figure 4:
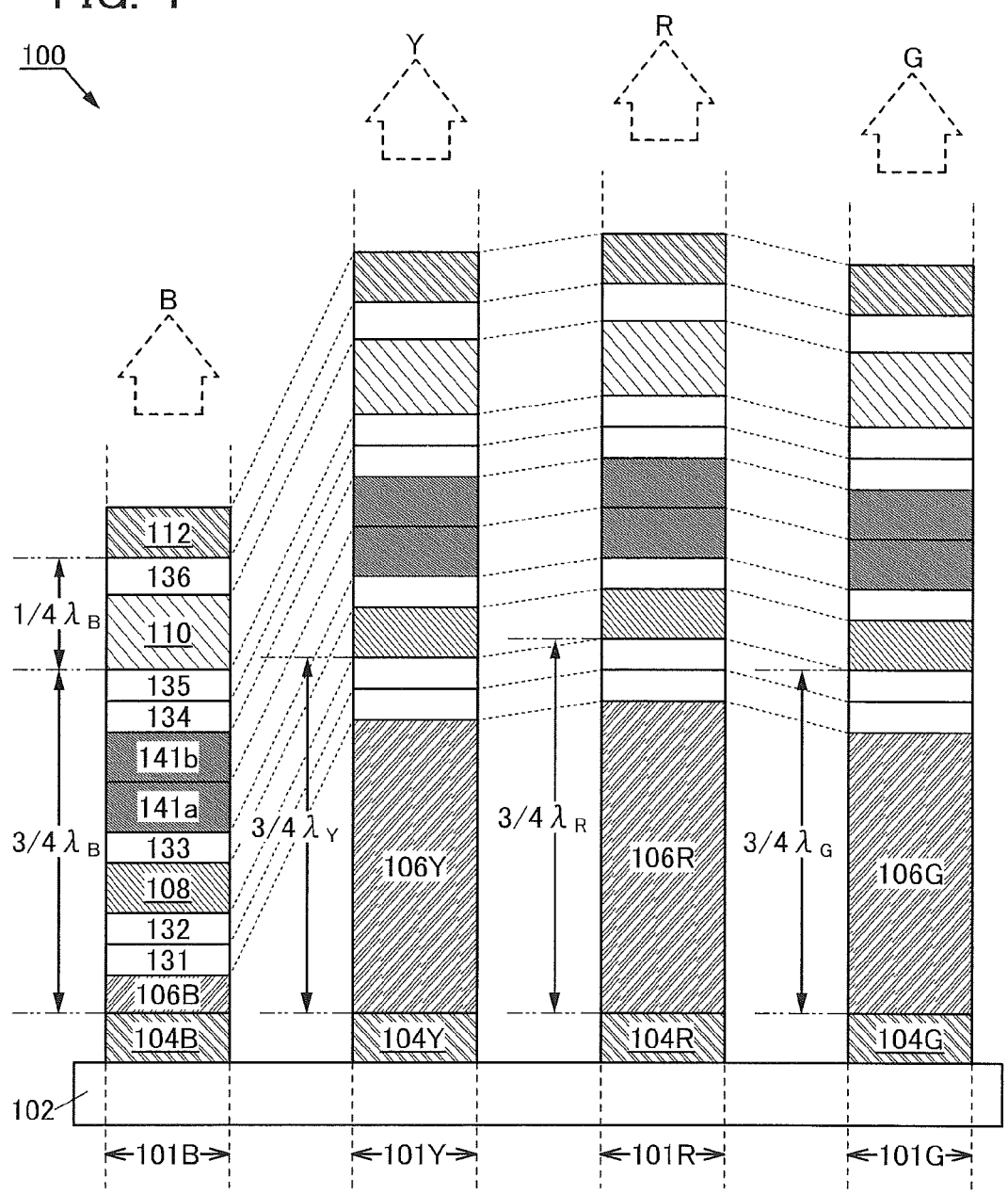
FIG. 4 is a cross-sectional view illustrating a light-emitting device.

FIG. 4 is a cross-sectional view illustrating an example of a light-emitting device of one embodiment of the present invention. In FIG. 4, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

The light-emitting device 100 illustrated in FIG. 4 includes the first light-emitting element 101B, the second light-emitting element 101Y, the third light-emitting element 101R, and a fourth light-emitting element 101G. The first light-emitting element 101B includes the first lower electrode 104B, the first transparent conductive layer 106B over the first lower electrode 104B, the first light-emitting layer 108 over the first transparent conductive layer 106B, the charge-generation layers 141a and 141b over the first light-emitting layer 108, the second light-emitting layer 110 over the charge-generation layers 141a and 141b, and the upper electrode 112 over the second light-emitting layer 110. The second light-emitting element 101Y includes the second lower electrode 104Y, the second transparent conductive layer 106Y over the second lower electrode 104Y, the first light-emitting layer 108 over the second transparent conductive layer 106Y, the charge-generation layers 141a and 141b over the first light-emitting layer 108, the second light-emitting layer 110 over the charge-generation layers 141a and 141b, and the upper electrode 112 over the second light-emitting layer 110. The third light-emitting element 101R includes the third lower electrode 104R, the third transparent conductive layer 106R over the third lower electrode 104R, the first light-emitting layer 108 over the third transparent conductive layer 106R, the charge-generation layers 141a and 141b over the first light-emitting layer 108, the second light-emitting layer 110 over the charge-generation layers 141a and 141b, and the upper electrode 112 over the second light-emitting layer 110. The fourth light-emitting element 101G includes a fourth lower electrode 104G, a fourth transparent conductive layer 106G over the fourth lower electrode 104G, the first light-emitting layer 108 over the fourth transparent conductive layer 106G, the charge-generation layers 141a and 141b over the first light-emitting layer 108, the second light-emitting layer 110 over the charge-generation layers 141a and 141b, and the upper electrode 112 over the second light-emitting layer 110.

The first light-emitting element 101B further includes the first transparent conductive layer 106B, the hole-injection layer 131, the hole-transport layer 132, the electron-transport layer 133, the hole-injection layer 134, the hole-transport layer 135, and the electron-transport layer 136. Note that in the first light-emitting element 101B, the first transparent conductive layer 106B, the hole-injection layer 131, and the hole-transport layer 132 are provided between the first lower electrode 104B and the first light-emitting layer 108.

The second light-emitting element 101Y further includes the second transparent conductive layer 106Y, the hole-injection layer 131, the hole-transport layer 132, the electron-transport layer 133, the hole-injection layer 134, the hole-transport layer 135, and the electron-transport layer 136. Note that in the second light-emitting element 101Y, the second transparent conductive layer 106Y, the hole-injection layer 131, and the hole-transport layer 132 are provided between the second lower electrode 104Y and the first light-emitting layer 108.

The third light-emitting element 101R further includes the third transparent conductive layer 106R, the hole-injection layer 131, the hole-transport layer 132, the electron-transport layer 133, the hole-injection layer 134, the hole-transport layer 135, and the electron-transport layer 136. Note that in the third light-emitting element 101R, the third transparent conductive layer 106R, the hole-injection layer 131, and the hole-transport layer 132 are provided between the third lower electrode 104R and the first light-emitting layer 108.

The fourth light-emitting element 101G further includes the fourth transparent conductive layer 106G, the hole-injection layer 131, the hole-transport layer 132, the electron-transport layer 133, the hole-injection layer 134, the hole-transport layer 135, and the electron-transport layer 136. Note that in the fourth light-emitting element 101G, the fourth transparent conductive layer 106G, the hole-injection layer 131, and the hole-transport layer 132 are provided between the fourth lower electrode 104G and the first light-emitting layer 108.

In each of the first light-emitting element 101B, the second light-emitting element 101Y, the third light-emitting element 101R, and the fourth light-emitting element 101G, the electron-transport layer 133, the charge-generation layers 141a and 141b, the hole-injection layer 134, and the hole-transport layer 135 are provided between the first light-emitting layer 108 and the second light-emitting layer 110. The electron-transport layer 136 is provided between the second light-emitting layer 110 and the upper electrode 112.

Light emitted from the first light-emitting element 101B has at least one peak in a wavelength range of greater than or equal to 400 nm and less than 480 nm, light emitted from the second light-emitting element 101Y has at least one peak in a wavelength range of greater than or equal to 550 nm and less than 600 nm, the light emitted from the third light-emitting element 101R has at least one peak in a wavelength range of greater than or equal to 600 nm and less than or equal to 740 nm, and the light emitted from the fourth light-emitting element 101G has at least one peak in a wavelength range of greater than or equal to 480 nm and less than 550 nm.

Light emitted from the first light-emitting layer 108 and the second light-emitting layer 110 resonates between three pairs of electrodes (a pair of the first lower electrode 104B and the upper electrode 112, a pair of the second lower electrode 104G and the upper electrode 112, and a pair of the third lower electrode 104R and the upper electrode 112). In the light-emitting device 100 illustrated in FIG. 4, the thickness of each of the first transparent conductive layer 106B, the second transparent conductive layer 106Y, the third transparent conductive layer 106R, and the fourth transparent conductive layer 106G in the light-emitting elements is adjusted so that desired wavelengths of light emitted from the first light-emitting layer 108 and light emitted from the second light-emitting layer 110 can be intensified.

Specifically, the optical path length between the first lower electrode 104B and the second light-emitting layer 110 is set to $3\lambda_B/4$ ($\lambda_B$ represents a wavelength of blue light) by adjusting the thickness of the first transparent conductive layer 106B; the optical path length between the second lower electrode 104Y and the first light-emitting layer 108 is set to $3\lambda_Y/4$ ($\lambda_Y$ represents a wavelength of yellow light) by adjusting the thickness of the second transparent conductive layer 106Y; the optical path length between the third lower electrode 104R and the first light-emitting layer 108 is set to $3\lambda_R/4$ ($\lambda_R$ represents a wavelength of red light) by adjusting the thickness of the third transparent conductive layer 106R; and the optical path length between the fourth lower electrode 104G and the first light-emitting layer 108 is set to $3\lambda_G/4$ ($\lambda_G$ represents a wavelength of green light) by adjusting the thickness of the fourth transparent conductive layer 106G.

By adjusting the thickness of the transparent conductive layer of each light-emitting element, the optical path length between the first lower electrode 104B and the upper electrode 112 is set to 4, the optical path length between the second lower electrode 104Y and the upper electrode 112 is set to $3\lambda_Y/2$, the optical path length between the third lower electrode 104R and the upper electrode 112 is set to $3\lambda_R/2$, and the optical path length between the fourth lower electrode 104G and the upper electrode 112 is set to $3\lambda_G/2$.

Figure 5:
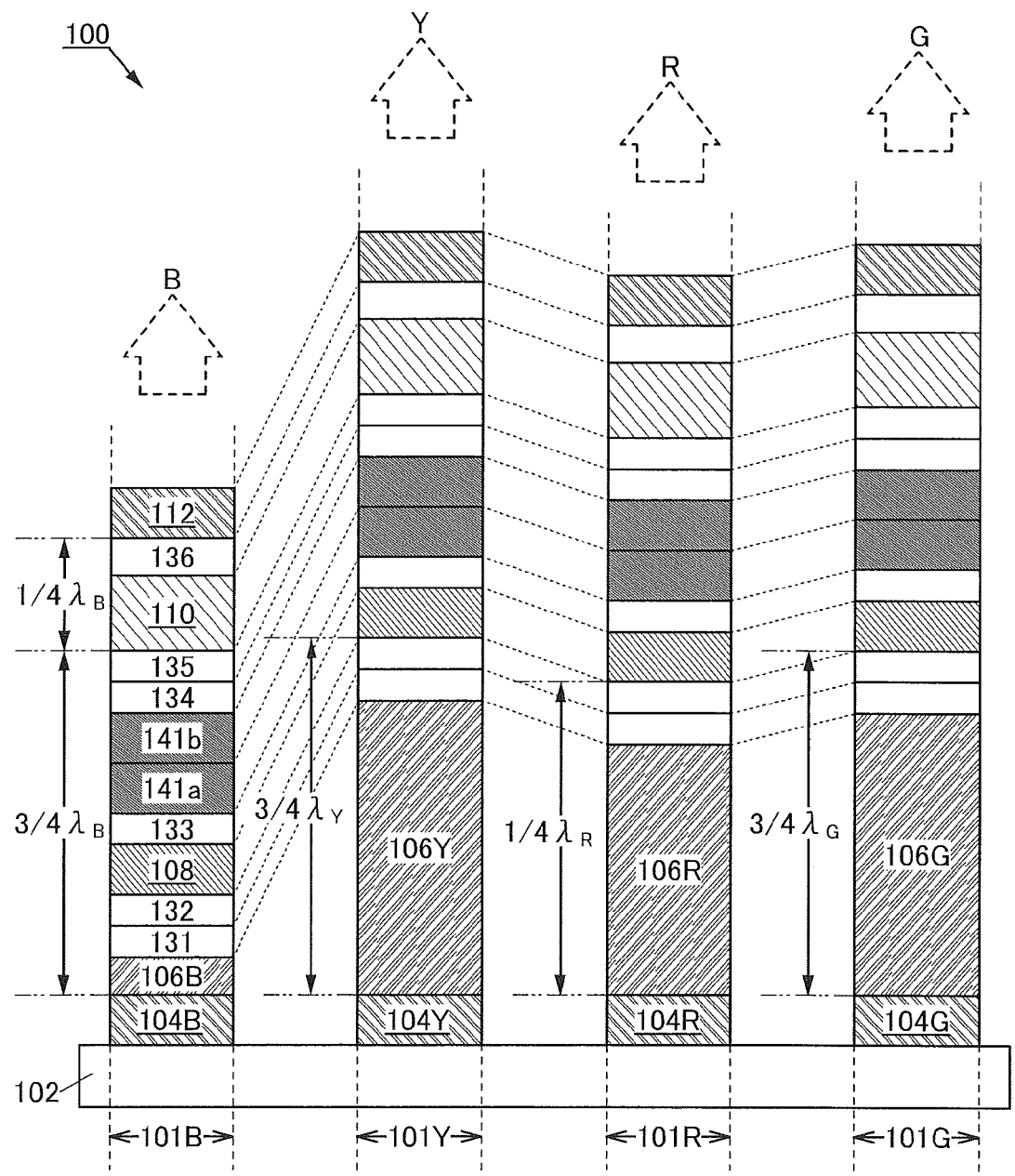
FIG. 5 is a cross-sectional view illustrating a light-emitting device.

Note that the optical path length between the third lower electrode 104R and the upper electrode 112 is not limited to the above-described optical path lengths. For example, the optical path length in FIG. 5 can be obtained by adjusting the thickness of the third transparent conductive layer 106R. FIG. 5 is a cross-sectional view illustrating an example of a light-emitting device of one embodiment of the present invention.

The light-emitting device 100 illustrated in FIG. 5 is the same as the light-emitting device 100 illustrated in FIG. 4 in the structures of the first light-emitting element 101B, the second light-emitting element 101Y, and the fourth light-emitting element 101G and is different therefrom in the optical path length between the third lower electrode 104R and the first light-emitting layer 108 in the third light-emitting element 101R. Specifically, by adjusting the thickness of the third transparent conductive layer 106R, the optical path length between the third lower electrode 104R and the first light-emitting layer 108 can be set to approximately $\lambda_R/4$ ($\lambda_R$ represents a wavelength of red light). By adjusting the thickness of the third transparent conductive layer 106R, the optical path length between the third lower electrode 104R and the upper electrode 112 can be set to approximately $\lambda_R$.

The other components are similar to those of the light-emitting device 100 illustrated in FIG. 1, and the effect similar to that in the case of the light-emitting device 100 is obtained.

<Structural Example 4 of Light-Emitting Device>

Next, a structural example different from the light-emitting device 100 illustrated in FIG. 1 is described below with reference to FIGS. 7 to 12.

FIGS. 7 to 12 are each a cross-sectional view illustrating an example of a light-emitting device of one embodiment of the present invention. In each of FIGS. 7 to 12, a portion having a function similar to that in FIG. 1 is represented by the same hatch pattern as in FIG. 1 and not especially denoted by a reference numeral in some cases. In addition, common reference numerals are used for portions having similar functions, and a detailed description of the portions is omitted in some cases.

Figure 7:
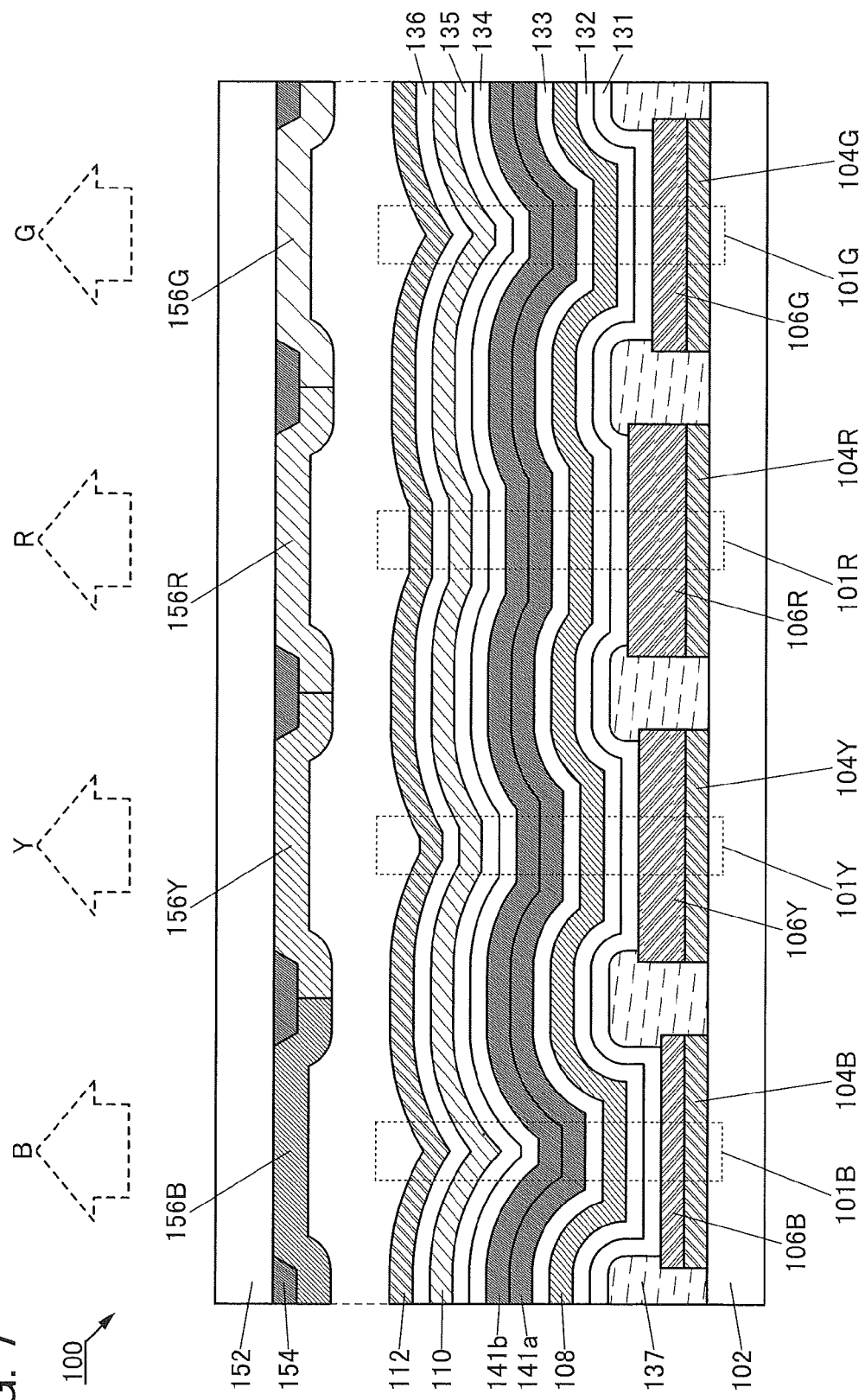
FIG. 7 is a cross-sectional view illustrating a light-emitting device.

The light-emitting device 100 illustrated in FIG. 7 includes a partition wall 137 and a substrate 152 in addition to the components of the light-emitting device 100 illustrated in FIG. 4. The partition walls 137 are provided at outer portions of the light-emitting elements and have a function of covering the end portions of either or both of the lower electrodes and the transparent conductive layers of the light-emitting elements. The substrate 152 is provided with a light-blocking layer 154, a first optical element 156R, a second optical element 156Y, a third optical element 156R, and a fourth optical element 156G. The light-blocking layer 154 is provided to overlap with the partition wall 137. The first optical element 156B, the second optical element 156Y, the third optical element 156R, and the fourth optical element 156G are provided to overlap with the first light-emitting element 101B, the second light-emitting element 101Y, the third light-emitting element 101R, and the fourth light-emitting element 101G, respectively.

Figure 8:
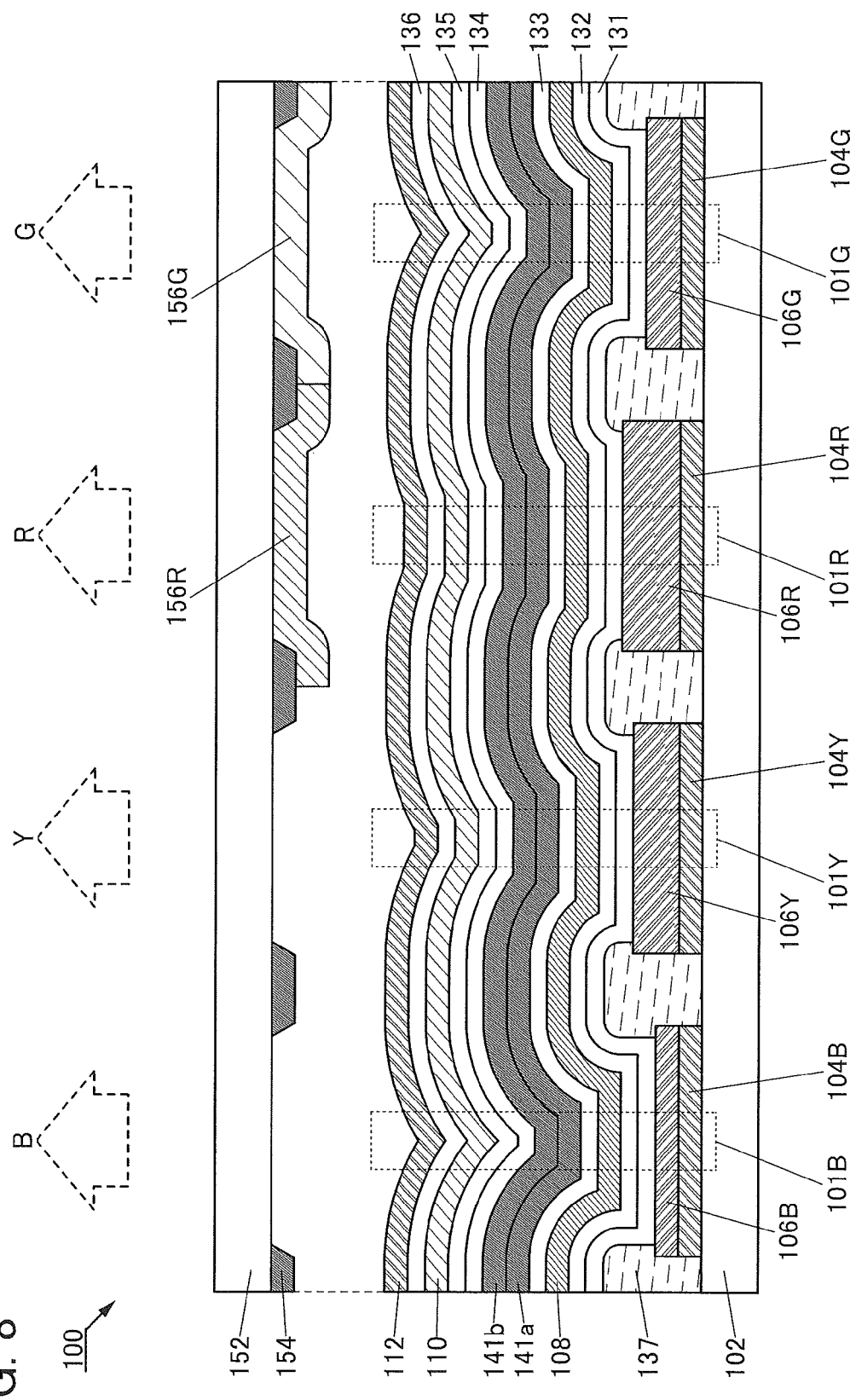
FIG. 8 is a cross-sectional view illustrating a light-emitting device.
Figure 9:
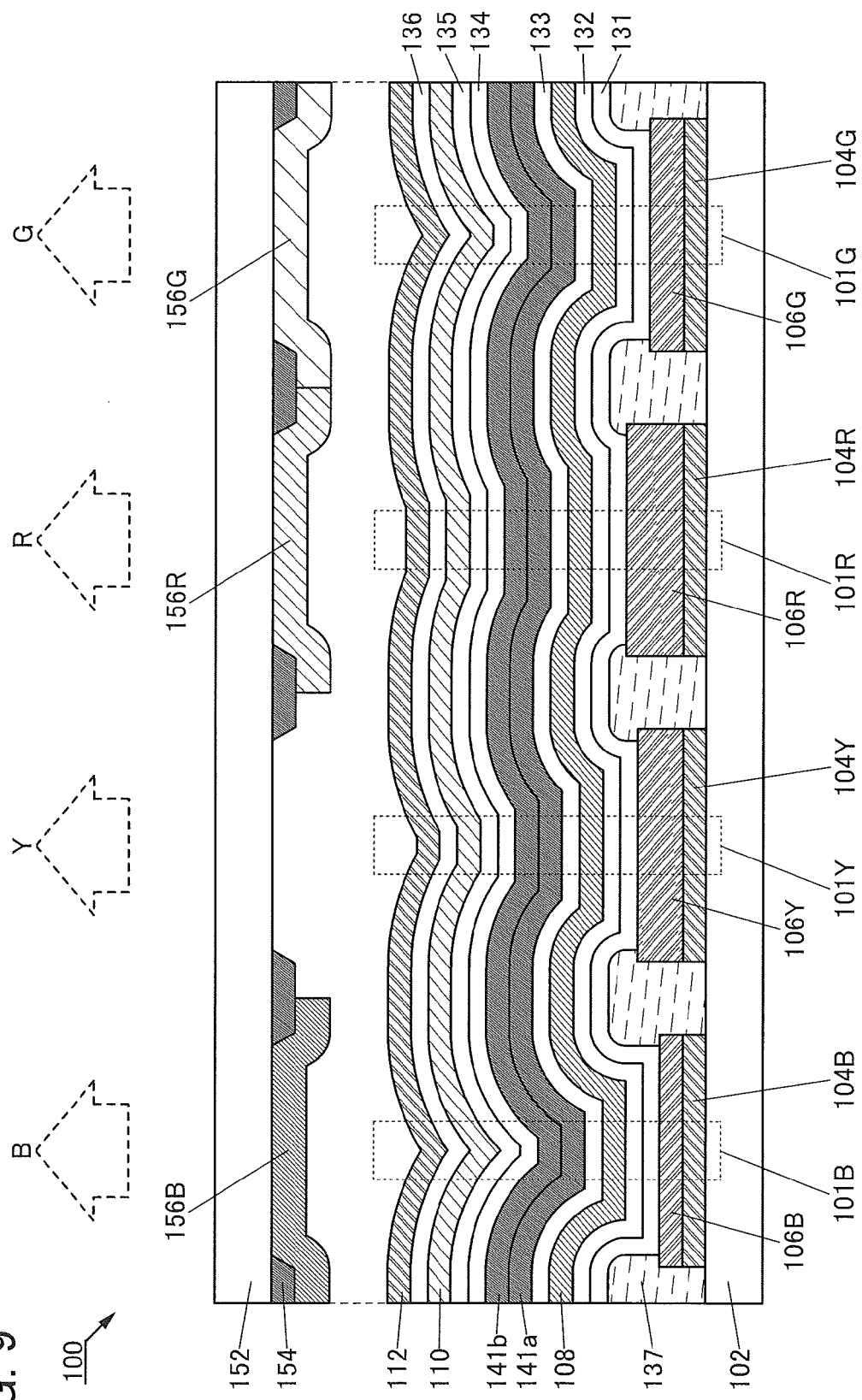
FIG. 9 is a cross-sectional view illustrating a light-emitting device.
Figure 10:
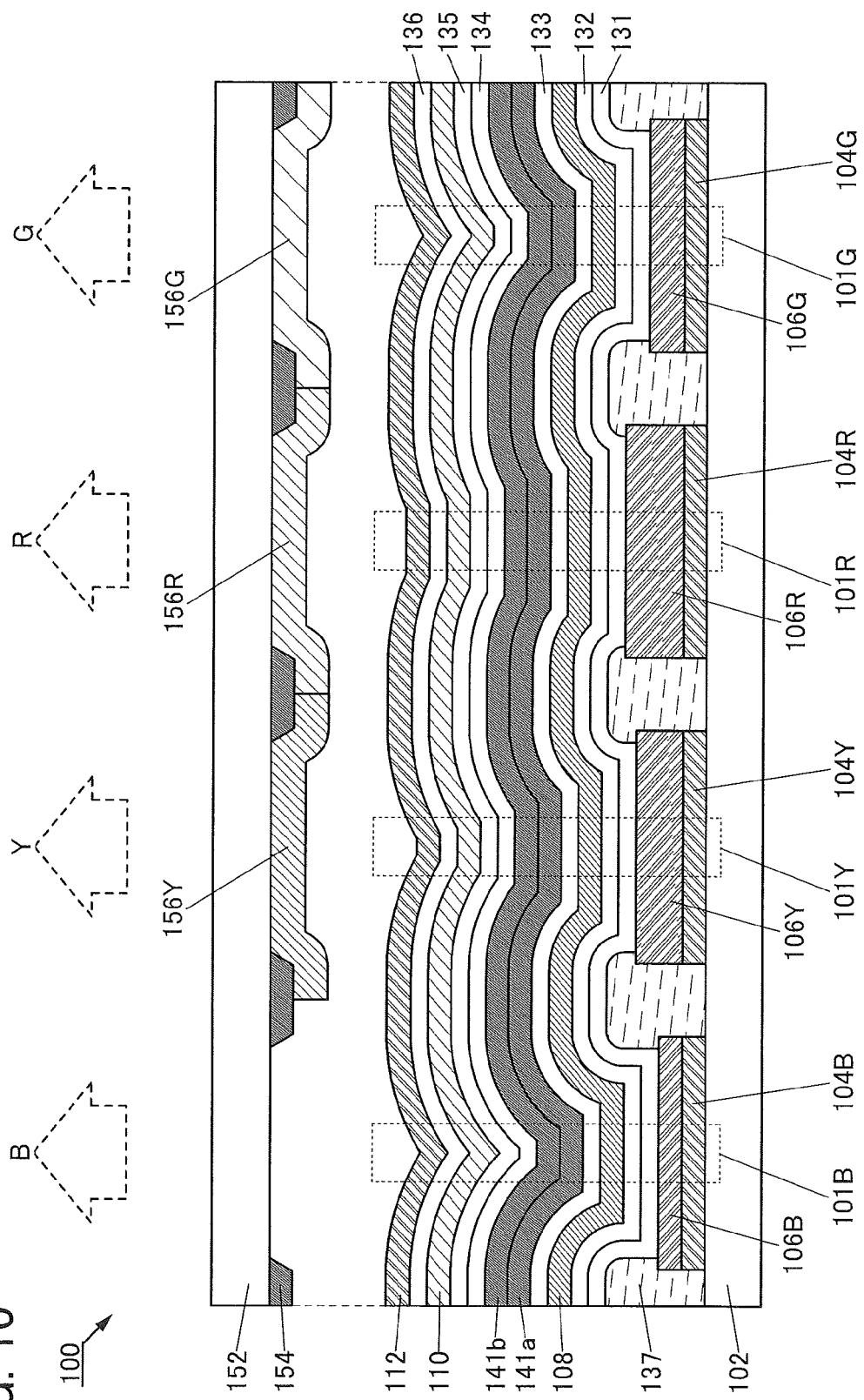
FIG. 10 is a cross-sectional view illustrating a light-emitting device.

In the light-emitting device 100 illustrated in FIG. 8, the first optical element 156B and the second optical element 156Y of the light-emitting device 100 illustrated in FIG. 7 are not provided. In the light-emitting device 100 illustrated in FIG. 9, the second optical element 156Y of the light-emitting device 100 illustrated in FIG. 7 is not provided. In the light-emitting device 100 illustrated in FIG. 10, the first optical element 156B of the light-emitting device 100 illustrated in FIG. 7 is not provided.

For example, with the use of a phosphorescent material emitting light in a yellow wavelength range for the first light-emitting layer 108 and a fluorescent material emitting light in a blue wavelength range for the second light-emitting layer 110, it is possible not to provide an optical element in at least one of the regions overlapping with the first light-emitting element 101B and the second light-emitting element 101Y. With a structure in which an optical element is not provided in at least one of the regions overlapping with the first light-emitting element 101B and the second light-emitting element 101Y, the power consumption of the light-emitting device 100 can be reduced. Particularly when the first light-emitting element 101B is not provided with the first optical element 156B, power consumption can be reduced more effectively. Note that to prevent external light reflection, as illustrated in FIG. 7, all of the light-emitting elements are preferred to be provided with the optical elements.

Figure 11:
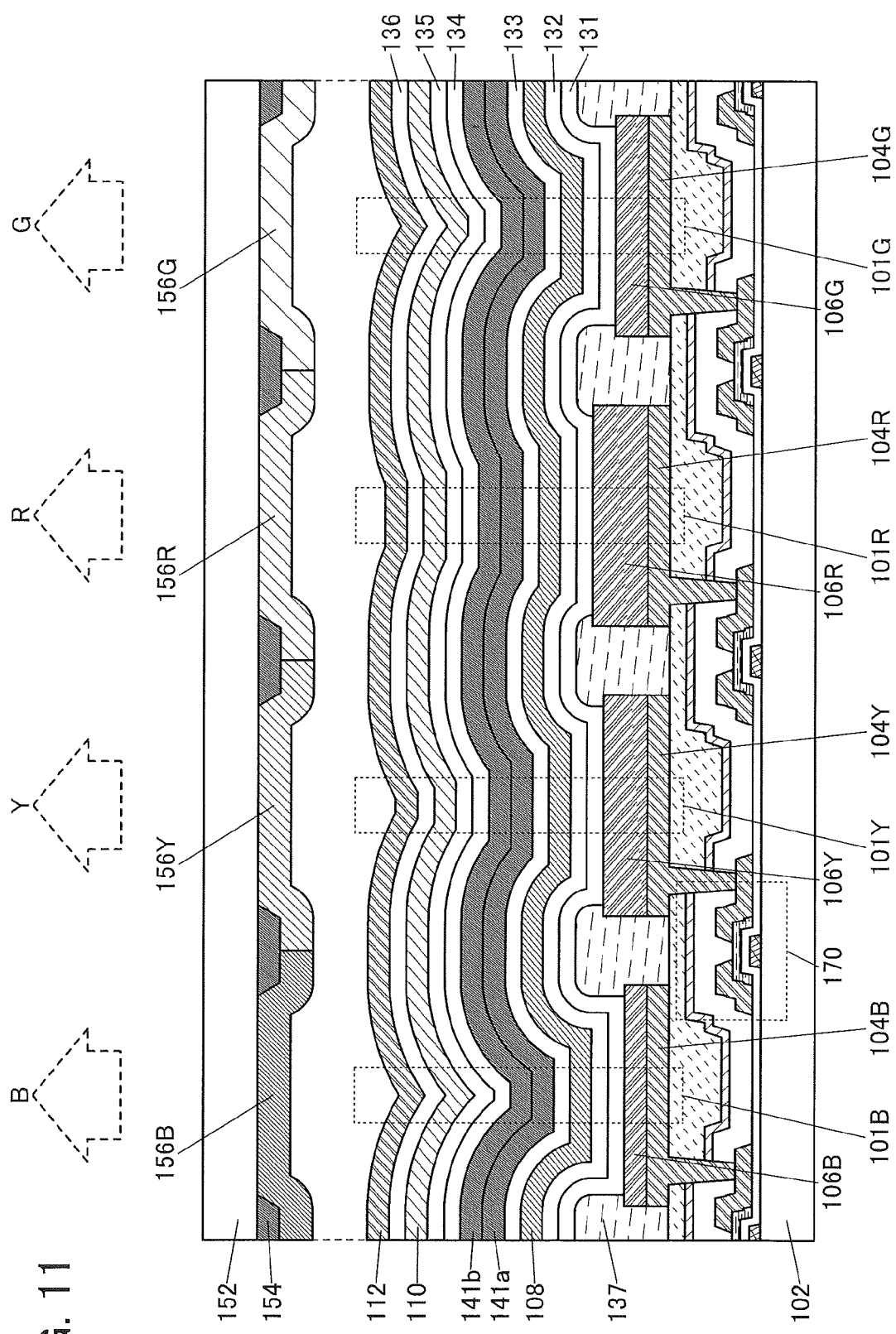
FIG. 11 is a cross-sectional view illustrating a light-emitting device.

FIG. 11 illustrates the light-emitting device 100 illustrated in FIG. 7, in which transistors are connected to the first light-emitting element 101B, the second light-emitting element 101Y, the third light-emitting element 101R, and the fourth light-emitting element 101G. In the light-emitting device 100 illustrated in FIG. 11, the lower electrodes of the light-emitting elements are each electrically connected to a transistor 170.

Figure 12:
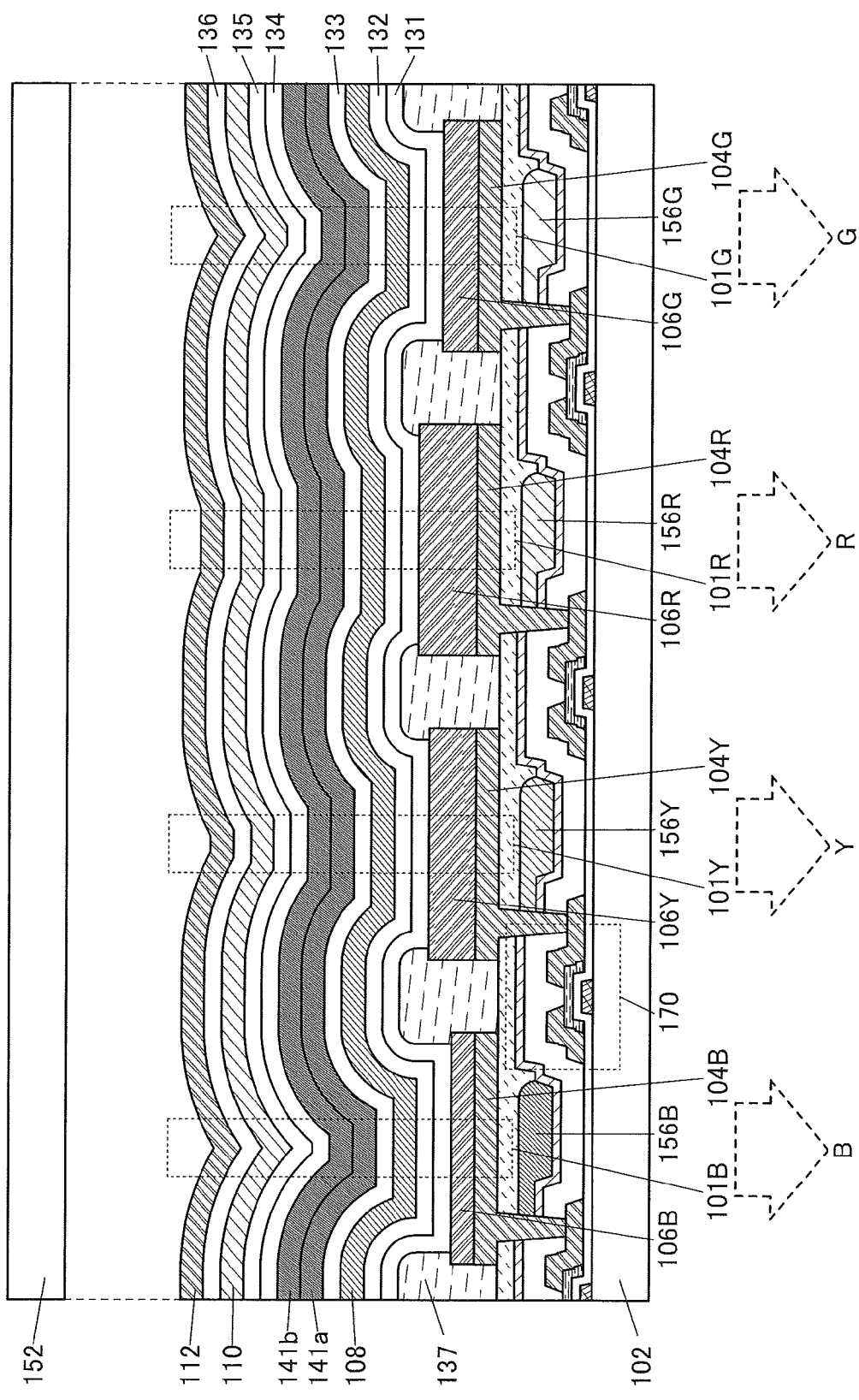
FIG. 12 is a cross-sectional view illustrating a light-emitting device.

FIG. 12 illustrates the light-emitting device 100 in which the optical elements (the first optical element 156B, the second optical element 156Y, the third optical element 156R, and the fourth optical element 156G) are each provided between the transistor 170 and the lower electrode. With the structure illustrated in FIG. 12, light extracted from the lower electrode is emitted to the substrate 102 side through the optical element. Note that with the structure illustrated in FIG. 12, in which the optical element or the like is not provided on the substrate 152 side, is preferable because manufacturing cost can be reduced.

Figure 13:
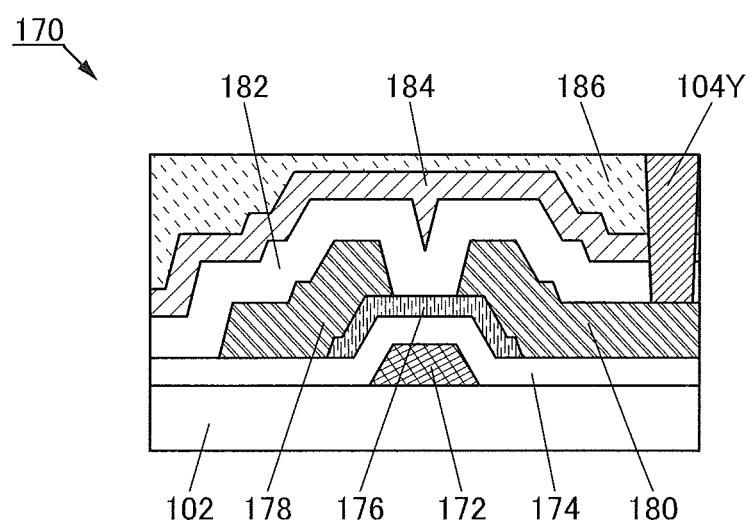
FIG. 13 is a cross-sectional view illustrating a transistor.

Note that the transistors 170 included in the light-emitting device 100 illustrated in FIGS. 11 and 12 are described in detail with reference to FIG. 13. FIG. 13 is a cross-sectional view of the transistor 170.

The transistor 170 illustrated in FIG. 13 includes a gate electrode 172 over the substrate 102, a gate insulating layer 174 over the substrate 102 and the gate electrode 172, a semiconductor layer 176 over the gate insulating layer 174, a source electrode 178 over the gate insulating layer 174 and the semiconductor layer 176, and a drain electrode 180 over the gate insulating layer 174 and the semiconductor layer 176. An insulating layer 182 is provided over the transistor 170, an insulating layer 184 is provided over the insulating layer 182, and an insulating layer 186 is provided over the insulating layer 184.

The insulating layer 182 is in contact with the semiconductor layer 176. The insulating layer 182 can be formed using an oxide insulating material, for example. The insulating layer 184 has a function of suppressing entry of impurities into the transistor 170. The insulating layer 184 can be formed using a nitride insulating material, for example. The insulating layer 186 has a function of planarizing unevenness and the like due to the transistor 170 and the like. The insulating layer 186 can be formed using an organic resin insulating material, for example.

An opening is formed in the insulating layers 182, 184, and 186. The drain electrode 180 of the transistor 170 and the lower electrode (here, the second lower electrode 104Y) are electrically connected to each other through the opening. Current or voltage flowing through the lower electrode can be controlled by driving the transistor 170.

Here, each component of the aforementioned light-emitting device 100 is described below in detail.

The substrate 102 is used as a support of the light-emitting elements. In addition, the substrate 152 is used as a support of the optical elements. For each of the substrates 102 and 152, glass, quartz, plastic, or the like can be used, for example. Alternatively, a flexible substrate can be used. The flexible substrate is a substrate that can be bent, for example, a plastic substrate made of polycarbonate, polyarylate, or polyethersulfone, and the like. A film (made of polypropylene, polyester, poly(vinyl fluoride), poly(vinyl chloride), or the like), an inorganic film formed by evaporation, or the like can be used. Another material may be used as long as the substrate functions as a support in a manufacturing process of the light-emitting elements or optical elements.

The light-emitting elements and the optical elements can be formed using a variety of substrates, for example. The type of substrate is not limited to a particular type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of the glass substrate include a barium borosilicate glass substrate, an aluminoborosilicate glass substrate, a soda lime glass substrate, and the like. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, polyvinyl chloride, and the like. Other examples are polyamide, polyimide, aramid, epoxy, an inorganic film formed by evaporation, paper, and the like.

Alternatively, a flexible substrate may be used as the substrate, and the light-emitting elements and the optical elements may be provided directly on the flexible substrate. Alternatively, a separation layer may be provided between the substrate and the light-emitting element. Alternatively, a separation layer may be provided between the substrate and the optical element. The separation layer can be used when part or the whole of the light-emitting elements and the optical elements fruited over the separation layer is completed, separated from the substrate, and transferred to another substrate. In such a case, the light-emitting elements and the optical elements can be transferred to a substrate having low heat resistance or a flexible substrate as well. For the above-described separation layer, a stack including inorganic films, which are a tungsten film and a silicon oxide film, or an organic resin film of polyimide or the like formed over a substrate can be used, for example.

In other words, after the light-emitting elements and the optical elements is formed using a substrate, the light-emitting elements and the optical elements may be transferred to another substrate. Examples of a substrate to which the light-emitting elements and the optical elements are transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a light-emitting element and optical element with high durability, a light-emitting element and optical element with high heat resistance, a lightweight light-emitting element and optical element, or a thin light-emitting element and optical element can be obtained.

<Lower Electrode>

The lower electrodes (the first lower electrode 104B, the second lower electrode 104Y, the third lower electrode 104R, and the fourth lower electrode 104G) function as anodes of the respective light-emitting elements. The lower electrodes are preferably formed using a reflective conductive material. As the conductive material, a conductive material having a visible-light reflectance higher than or equal to 40% and lower than or equal to 100%, preferably higher than or equal to 70% and lower than or equal to 100%, and a resistivity lower than or equal to $1 \times 10^{-2}$ Ωcm can be used. Specifically, as the lower electrode, silver, aluminum, an alloy containing silver or aluminum, or the like can be used. As the alloy containing aluminum, an alloy containing aluminum, nickel, and lanthanum can be used, for example. Examples of the alloy containing silver include an alloy containing silver, palladium, and copper, an alloy containing silver and copper, an alloy containing silver and magnesium, an alloy containing silver and nickel, and an alloy containing silver and gold. The lower electrodes can be formed by a sputtering method, an evaporation method, a printing method, a coating method, or the like.

<Transparent Conductive Layer>

The transparent conductive layers (the first transparent conductive layer 106B, the second transparent conductive layer 106Y, the third transparent conductive layer 106R, and the fourth transparent conductive layer 106G) function as part of the lower electrodes of the respective light-emitting elements, or the anodes of the respective light-emitting elements. Furthermore, the transparent conductive layer is used to adjust the optical path length between the lower electrode and the upper electrode in accordance with the desired light wavelength so as to produce resonance of the desired light emitted from the light-emitting layer and intensify its wavelength. For example, the thickness of the transparent conductive layer is adjusted so that the optical path length between the electrodes can be $m\lambda/2$ (m is a natural number), where k is the wavelength of a desired light.

As the transparent conductive layer, for example, indium oxide-tin oxide (indium tin oxide (hereinafter referred to as ITO)), indium oxide-tin oxide containing silicon or silicon oxide, indium oxide-zinc oxide (indium zinc oxide), indium oxide containing tungsten oxide and zinc oxide, or the like can be used. In particular, a material with a high work function (4.0 eV or more) is preferably used as the transparent conductive layer. The transparent conductive layer can be formed by a sputtering method, an evaporation method, a printing method, a coating method, or the like.

<Upper Electrode>

The upper electrode 112 functions as a cathode in each of the light-emitting elements. The upper electrode 112 is preferably formed using a reflective and light-transmitting conductive material. As the conductive material, a conductive material having a visible-light reflectance higher than or equal to 20% and lower than or equal to 80%, preferably higher than or equal to 40% and lower than or equal to 70%, and a resistivity lower than or equal to $1\times10^{-2}$ Ωcm can be used. The upper electrode 114 can be formed using one or more kinds of conductive metals, alloys, conductive compounds, and the like. In particular, it is preferable to use a material with a low work function (lower than or equal to 3.8 eV). The examples include an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, an alloy containing any of these rare earth metals, aluminum, silver, and the like. The upper electrode 114 can be formed by a sputtering method, an evaporation method, a printing method, a coating method, or the like.

In addition, a bottom-emission light-emitting device can be obtained by interchanging the materials used for the lower electrode and the upper electrode with each other as illustrated in FIG. 6 or 12. In the case of the bottom-emission light-emitting device, the lower electrode is formed using a reflective and light-transmitting conductive material, and the upper electrode is formed using a reflective conductive material.

<Partition Wall>

The partition wall 137 has an insulating property and is formed using an inorganic or organic material. Examples of the inorganic material include a silicon oxide film, a silicon oxynitride film, a silicon nitride oxide film, a silicon nitride film, an aluminum oxide film, an aluminum nitride film, and the like. Examples of the organic material include photosensitive resin materials such as an acrylic resin and a polyimide resin.

<Light-Emitting Layer>

The first light-emitting layer 108 contains a light-emitting material that emits light of any one of green, yellow green, yellow, orange, and red, and the second light-emitting layer 110 contains a light-emitting material that emits light of any one of violet, blue, and blue green. The light-emitting material used for the first light-emitting layer 108 is preferably a phosphorescent material, and the light-emitting material used for the second light-emitting layer 110 is preferably a fluorescent material. When a phosphorescent material is used for the first light-emitting layer 108 and a fluorescent material is used for the second light-emitting layer 110, a light-emitting device with high emission efficiency and high reliability can be obtained. The first light-emitting layer 108 and the second light-emitting layer 110 include either or both of an electron-transport material and a hole-transport material in addition to the above-described materials.

As the phosphorescent material, a light-emitting substance that converts triplet excitation energy into light emission can be used. As the fluorescent material, a light-emitting substance that converts singlet excitation energy into light emission can be used. Examples of the light-emitting substances are described below.

Examples of the light-emitting substance that converts singlet excitation energy into light emission include substances that emit fluorescence. For example, the following substances can be used: substances that emit blue light (emission wavelength: 400 nm to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenylpyrene-1,6-diamine (abbreviation: 1,6FLPAPrn), and N,N'-bis(3-methylphenyl)-N,N'-bis[3-(9-phenyl-9H-fluoren-9-yl)phenyl]pyrene-1,6-diamine (abbreviation: 1,6mMemFLPAPrn); and substances that emit yellow light (emission wavelength: 540 nm to 580 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2).

Examples of the light-emitting substance that converts triplet excitation energy into light emission include substances that emit phosphorescence. For example, a substance having an emission peak at 440 nm to 520 nm, a substance having an emission peak at 520 nm to 600 nm, or a substance having an emission peak at 600 nm to 700 nm can be used.

Examples of the substance that has an emission peak at 440 nm to 520 nm include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)₃), tris(5-methyl-3,4-diphenyl-4H-1,2,4-triazolato)

iridium(III) (abbreviation: Ir(Mptz)₃), and tris[4-(3-biphenyl)-5-isopropyl-3-phenyl-4H-1,2,4-triazolato]iridium (III) (abbreviation: Ir(iPrptz-3b)₃); organometallic iridium complexes having 1H-triazole skeletons, such as tris[3-methyl-1-(2-methylphenyl)-5-phenyl-1H-1,2,4-triazolato] iridium(III) (abbreviation: Ir(Mptz1-mp)₃) and tris(1-methyl-5-phenyl-3-propyl-1H-1,2,4-triazolato)iridium(M) (abbreviation: Ir(Prptz1-Me)₃); organometallic iridium complexes having imidazole skeletons, such as fac-tris[1-(2,6-diisopropylphenyl)-2-phenyl-1H-imidazole]iridium(III) (abbreviation: Ir(iPrpmi)₃) and tris[3-(2,6-dimethylphenyl)-7-methylimidazo[1,2-f]phenanthridinato]iridium(III) (abbreviation: Ir(dmpimpt-Me)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²'}iridium(III) picolinate (abbreviation: Ir(CF₃ppy)₂(pic)), and bis[2-(4',6'-difluorophenyl)pyridinato-N,C²']iridium(III)acetylacetonate (abbreviation: FIr(acac)). Among the substances given above, the organometallic iridium complex having a 4H-triazole skeleton has a high reliability and high emission efficiency and is thus especially preferable.

Examples of the substance that has an emission peak at 520 nm to 600 nm include organometallic iridium complexes having pyrimidine skeletons, such as (4-methyl-6-phenylpyrimidinato)iridium(III) (abbreviation: Ir(mppm)₃), tris(4-t-butyl-6-phenylpyrimidinato)iridium (III) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[4-(2-norbornyl)-6-phenylpyrimidinato]iridium(III) (abbreviation: Ir(nbppm)₂(acac)), (acetylacetonato)bis[5-methyl-6-(2-methylphenyl)-4-phenylpyrimidinato]iridium(III) (abbreviation: Ir(mpmppm)₂(acac)), and (acetylacetonato)bis(4,6-diphenylpyrimidinato) iridium(III) (abbreviation: Ir(dppm)₂(acac)); organometallic iridium complexes having pyrazine skeletons, such as (acetylacetonato)bis(3,5-dimethyl-2-phenylpyrazinato) iridium(III) (abbreviation: Ir(mppr-Me)₂(acac)) and (acetylacetonato)bis(5-isopropyl-3-methyl-2-phenylpyrazinato) iridium(III) (abbreviation: Ir(mppr-iPr)₂(acac)); organometallic iridium complexes having pyridine skeletons, such as tris(2-phenylpyridinato-N,C²')iridium(III) (abbreviation: Ir(ppy)₃), bis(2-phenylpyridinato-N,C²') iridium(III)acetylacetonate (abbreviation: Ir(ppy)₂(acac)), bis(benzo[h]quinolinato)iridium(III)acetylacetonate (abbreviation: Ir(bzq)₂(acac)), tris(benzo[h]quinolinato)iridium (III) (abbreviation: Ir(bzq)₃), tris(2-phenylquinolinato-N, C²')iridium(III) (abbreviation: Ir(pq)₃), and bis(2-phenylquinolinato-N,C²')iridium(III)acetylacetonate (abbreviation: Ir(pq)₂(acac)); and a rare earth metal complex such as tris(acetylacetonato) (monophenanthroline)terbium (III) (abbreviation: Tb(acac)₃(Phen)). Among the substances given above, the organometallic iridium complex having a pyrimidine skeleton has distinctively high reliability and emission efficiency and is thus especially preferable.

Among the substances having an emission peak at 520 nm to 600 nm, it is particularly preferable to use a substance having an emission peak at 550 nm to 580 nm for the first light-emitting layer 108. With the use of the substance having an emission peak at 550 nm to 580 nm for the first light-emitting layer 108, the current efficiency of the light-emitting element can be increased.

Examples of the substances that has an emission peak at 550 nm to 580 nm include (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[6-(2-norbornyl)-4-phenylpyrimidinato]iridium(III) (abbreviation: Ir(nbppm)₂(acac)), (acetylacetonato)bis[5-methyl-6-(2-methylphenyl)-4-phenylpyrimidinato]iridium(III) (abbreviation: Ir(mpmppm)₂(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)₂(acac)), (acetylacetonato)bis (4,6-diphenylpyrimidinato)iridium(III) (abbreviation: Ir(dppm)₂(acac)), (acetylacetonato)bis(3,5-dimethyl-2-phenylpyrazinato)iridium(III) (abbreviation: Ir(mppr-Me)₂(acac)), (acetylacetonato)bis(5-isopropyl-3-methyl-2-phenylpyrazinato)iridium(III) (abbreviation: Ir(mppr-iPr)₂(acac)), tris(2-phenylquinolinato-N,C²')iridium(III) (abbreviation: Ir(pq)₃), bis(2-phenylquinolinato-N,C²') iridium(III)acetylacetonate (abbreviation: Ir(pq)₂(acac)), bis (benzo[h]quinolinato)iridium(III)acetylacetonate (abbreviation: Ir(bzq)₂(acac)), bis(2,4-diphenyl-1,3-oxazolato-N,C²') iridium(III)acetylacetonate (abbreviation: Ir(dpo)₂(acac)), bis{2-[4'-(perfluorophenyl)phenyl]pyridinato-N, C²'}iridium(III) acetylacetonate (abbreviation: Ir(p-PF-ph)₂(acac)), bis(2-phenylbenzothiazolato-N,C²')iridium(III) acetylacetonate (abbreviation: Ir(bt)₂(acac)), and the like can be used.

Examples of the substance that has an emission peak at 600 nm to 700 nm include organometallic iridium complexes having pyrimidine skeletons, such as (diisobutyrylmethanato)bis[4,6-bis(3-methylphenyl)pyrimidinato] iridium(III) (abbreviation: Ir(5mdppm)₂(dibm)), bis[4,6-bis (3-methylphenyl)pyrimidinato](dipivaloylmethanato) iridium(III) (abbreviation: Ir(5mdppm)₂(dpm)), and bis[4,6-di(naphthalen-1-yl)pyrimidinato](dipivaloylmethanato) iridium(III) (abbreviation: Ir(d1npm)₂(dpm)); organometallic iridium complexes having pyrazine skeletons, such as (acetylacetonato)bis(2,3,5-triphenylpyrazinato)iridium(III) (abbreviation: Ir(tppr)₂(acac)), bis(2,3,5-triphenylpyrazinato)(dipivaloylmethanato)iridium(III) (abbreviation: Ir(tppr)₂(dpm)), and (acetylacetonato)bis[2,3-bis(4-fluorophenyl)quinoxalinato]iridium(III) (abbreviation: Ir(Fdpq)₂(acac)); organometallic iridium complexes having pyridine skeletons, such as tris(1-phenylisoquinolinato-N,C²')iridium (III) (abbreviation: Ir(piq)₃) and bis(1-phenylisoquinolinato-N,C²')iridium(III)acetylacetonate (abbreviation: Ir(piq)₂(acac)); a platinum complex such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenanthroline)europium(III) (abbreviation: Eu(DBM)₃ (Phen)) and tris[1-(2-thenoyl)-3,3,3-trifluoroacetonato] (monophenanthroline)europium(III) (abbreviation: Eu(TTA)₃(Phen)). Among the substances given above, the organometallic iridium complex having a pyrimidine skeleton has distinctively high reliability and emission efficiency and is thus especially preferable. Furthermore, the organometallic iridium complex having a pyrazine skeleton can provide red light emission with favorable chromaticity.

As the electron-transport material used for the first light-emitting layer 108 and the second light-emitting layer 110, a π-electron deficient heteroaromatic compound such as a nitrogen-containing heteroaromatic compound is preferable. As the electron-transport material, a π-electron deficient heteroaromatic compound, a metal complex, or the like can be used. Specific examples include a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDRTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); a heterocyclic compound having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); and a heterocyclic compound having a pyridine skeleton such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above-described materials, heterocyclic compounds having diazine skeletons and triazine skeletons and heterocyclic compounds having pyridine skeletons have high reliability and are thus preferable. Heterocyclic compounds having diazine (pyrimidine or pyrazine) skeletons and triazine skeletons have a high electron-transport property and contribute to a decrease in drive voltage.

As the hole-transport material used for the first light-emitting layer 108 and the second light-emitting layer 110, a π-electron deficient heteroaromatic compound or an aromatic amine compound is preferable. A π-electron deficient heteroaromatic compound, an aromatic amine compound, or the like can be preferably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-N-[4-(9-phenyl-9H-carbazol-3-yl)phenyl]-9,9-dimethyl-9H-fluoren-2-amine (abbreviation: PCBBiF); a compound having a carbazole skeleton such as 1,3-bis(N-carbazolyl)benzene (abbreviation: mCP), 4,4'-di(N-carbazolyl)biphenyl (abbreviation: CBP), and 3,6-bis(3,5-diphenylphenyl)-9-phenylcarbazole (abbreviation: CzTP), or 9-phenyl-9H-3-(9-phenyl-9H-carbazol-3-yl)carbazole (abbreviation: PCCP); a compound having a thiophene skeleton such as 1,3,5-tri(dibenzothiophen-4-yl)benzene (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above-described materials, compounds having aromatic amine skeletons and compounds having carbazole skeletons are preferable because these compounds are highly reliable and have high hole-transport properties to contribute to a reduction in drive voltage.

Furthermore, as the hole-transport material used for the first light-emitting layer 108 and the second light-emitting layer 110, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-M-phenylamin}phenyl)methacrylamide] (abbreviation: PTPDMA), or poly[N,N'-bis(4-butylphenyl)-N,N'-bis(phenyl)benzidine] (abbreviation: Poly-TPD) can also be used.

<Hole-Injection Layer and Hole-Transport Layer>

The hole-injection layer 131 is a layer that injects holes into the first light-emitting layer 108 through the hole-transport layer 132 with a high hole-transport property and includes a hole-transport material and an acceptor substance. When a hole-transport material and an acceptor substance are included, electrons are extracted from the hole-transport material by the acceptor substance to generate holes, and the holes are injected into the first light-emitting layer 108 through the hole-transport layer 132. The hole-injection layer 134 is a layer that injects holes into the second light-emitting layer 110 through the hole-transport layer 135 with a high hole-transport property and includes a hole-transport material and an acceptor substance. When a hole-transport material and an acceptor substance are included, electrons are extracted from the hole-transport material by the acceptor substance to generate holes, and the holes are injected into the second light-emitting layer 110 through the hole-transport layer 135.

Note that the hole-injection layer 131, the hole-transport layer 132, the hole-injection layer 134, and the hole-transport layer 135 are formed using a hole-transport material. As a hole-transport material used for the hole-injection layer 131, the hole-transport layer 132, the hole-injection layer 134, and the hole-transport layer 135, a material similar to the aforementioned hole-transport material used for the first light-emitting layer 108 and the second light-emitting layer 110 can be used.

Examples of the acceptor substance used for the hole-injection layers 131 and 134 include an oxide of a metal belonging to any of Group 4 to Group 8 of the periodic table. Specifically, molybdenum oxide is particularly preferable.

The hole-injection layer 131 and the hole-transport layer 132 may be formed using a material different between light-emitting layers or with a different thickness in some cases.

<Electron-Transport Layer>

As an electron-transport material used for the electron-transport layers 133 and 136, a material similar to the aforementioned electron-transport material used for the first light-emitting layer 108 and the second light-emitting layer 110 can be used.

<Electron-Injection Layer>

Although not illustrated, a layer with an electron-injection property (an electron-injection layer) may be provided over one or both of the electron-transport layers 133 and 136. The electron-injection layer is a layer including a substance with a high electron-injection property. For the electron-injection layer, an alkali metal, an alkaline earth metal, or a compound thereof, such as lithium fluoride (LiF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layer. Examples of the electride include a substance in which electrons are added at high concentration to calcium oxide-aluminum oxide, and the like.

Alternatively, the electron-injection layer may be formed using a composite material in which an organic compound and an electron donor (donor) are mixed. The composite material is superior in an electron-injection property and an electron-transport property, because electrons are generated in the organic compound by the electron donor. The organic compound here is preferably a material excellent in transporting the generated electrons; specifically, for example, the substances for forming the electron-transport layer 133 (e.g., a metal complex or a heteroaromatic compound) can be used. As the electron donor, a substance showing an electron-donating property with respect to the organic compound is used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

The electron-transport layers 133 and 136 and the electron-injection layers may be formed using a material different between light-emitting layers or with a different thickness in some cases.

<Charge-Generation Layer>

The charge-generation layers 141a and 141b has a function of injecting electrons into one of the light-emitting layers (the first light-emitting layer 108 or the second light-emitting layer 110) and injecting holes into the other light-emitting layer (the first light-emitting layer 108 or the second light-emitting layer 110), when a voltage is applied between a pair of electrodes (the lower electrode and the upper electrode).

For example, in the first light-emitting element 101B illustrated in FIG. 1, when a voltage is applied such that the potential of the first lower electrode 104B is higher than that of the upper electrode 112, the charge-generation layer 141a injects electrons into the first light-emitting layer 108 and the charge-generation layer 141b injects holes into the second light-emitting layer 110.

Note that in terms of light extraction efficiency, the charge-generation layers 141a and 141b preferably transmit visible light (specifically, the charge-generation layers 141a and 141b have a high visible light transmittance (e.g., a visible light transmittance higher than or equal to 40%). The charge-generation layers 141a and 141b function even if it has lower conductivity than the pair of electrodes (the lower electrode and the upper electrode).

The charge-generation layers 141a and 141b can have either a structure in which an acceptor substance is added to a hole-transport material or a structure in which a donor substance is added to an electron-transport material. Alternatively, both of these structures may be stacked.

Note that forming the charge-generation layers 141a and 141b by using any of the above materials can suppress an increase in drive voltage caused by the stack of the light-emitting layers.

The above-described light-emitting layers, hole-transport layer, hole-injection layer, electron-transport layer, electron-injection layer, and charge-generation layers can each be formed by any of the following methods: an evaporation method (including a vacuum evaporation method), an ink-jet method, a coating method, and the like.

<Light-Blocking Layer>

The light-blocking layer 154 has a function of reducing the reflection of external light. The light-blocking layer 154 has a function of preventing mixture of light emitted from an adjacent light-emitting element. As the light-blocking layer 154, a metal, a resin containing black pigment, carbon black, a metal oxide, a composite oxide containing a solid solution of a plurality of metal oxides, or the like can be used.

<Light-Emitting Element>

The first optical element 156B, the second optical element 156Y, the third optical element 156R, and the fourth optical element 156G selectively transmit light with a particular color out of incident light. For example, a color filter, a band pass filter, a multilayer filter, or the like can be used. Color conversion elements can be used as the optical elements. A color conversion element is an optical element that converts incident light into light having a longer wavelength than the incident light. As the color conversion elements, quantum-dot elements are preferably used. The usage of the quantum-dot type can increase color reproducibility of the light-emitting device.

The first optical element 156B has a function of transmitting light in a blue wavelength range out of light emitted from the first light-emitting element 101B. The second optical element 156Y has a function of transmitting light in a yellow wavelength range out of light emitted from the second light-emitting element 101Y. The third optical element 156R has a function of transmitting light in a red wavelength range out of light emitted from the third light-emitting element 101R. In addition, the fourth optical element 156G has a function of transmitting light in a green wavelength range out of light emitted from the fourth light-emitting element 101G.

Note that an optical element different from the above-described optical elements may be provided so as to overlap with each of the light-emitting elements. As another optical element, for example, a circularly polarizing plate, an anti-reflective film, and the like can be given. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. Accordingly, light emitted from the light-emitting device can be observed clearly.

The above-described structures of the light-emitting devices can be combined as appropriate.

<Manufacturing Method of Light-Emitting Device>

Next, a manufacturing method of a light-emitting device of one embodiment of the present invention is described below with reference to FIGS. 14A and 14B, FIGS. 15A and 15B, and FIGS. 16A and 16B. Here, a manufacturing method of the light-emitting device 100 illustrated in FIG. 7 is described.

FIGS. 14A and 14B, FIGS. 15A and 15B, and FIGS. 16A and 16B are cross-sectional views for illustrating the manufacturing method of the light-emitting device of one embodiment of the present invention.

The manufacturing method of the light-emitting device 100 described below includes first to sixth steps.

<First Step>

Figure 14A:
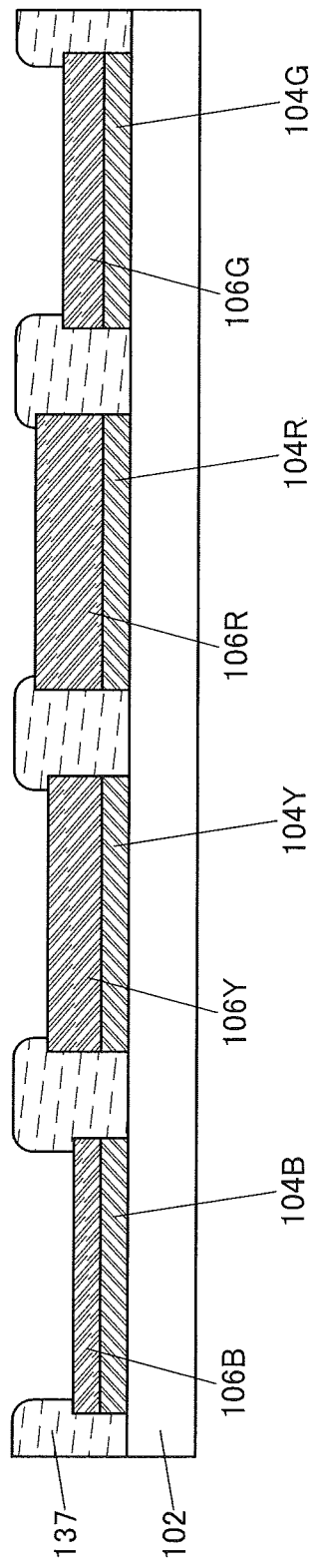
FIGS. 14A and 14B are cross-sectional views illustrating a method for manufacturing a light-emitting device.

The first step is a step for forming the lower electrodes (the first lower electrode 104B, the second lower electrode 104Y, the third lower electrode 104R, and the fourth lower electrode 104G) of the light-emitting elements, the transparent conductive layers (the first transparent conductive layer 106B, the second transparent conductive layer 106Y, the third transparent conductive layer 106R, and the fourth transparent conductive layer 106G) of the light-emitting elements, and the partition wall 137 covering end portions of the lower electrode and the transparent conductive layer of each light-emitting element (see FIG. 14A).

In the first step, since there is no possibility of damaging a light-emitting layer containing an organic compound, a variety of micromachining technologies can be employed. In this embodiment, a reflective conductive film is formed by a sputtering method, subjected to patterning by a photolithography technique, and then processed into an island shape by a dry etching method to form the first lower electrode 104B, the second lower electrode 104Y, the third lower electrode 104R, and the fourth lower electrode 104G.

Next, a light-transmitting conductive film is formed over the first lower electrode 104B, subjected to patterning by a photolithography technique, and then processed into an island shape by a wet etching method to form the first transparent conductive layer 106B. After that, a light-transmitting conductive film is formed over the second lower electrode 104Y, subjected to patterning by a photolithography technique, and then processed into island shapes by a wet etching method to form the second transparent conductive layer 106Y. Next, a light-transmitting conductive film is formed over the third lower electrode 104R, subjected to patterning by a photolithography technique, and then processed into island shapes by a wet etching method to form the third transparent conductive layer 106R. Then, a light-transmitting conductive film is formed over the fourth lower electrode 104G, subjected to patterning by a photolithography technique, and then processed into island shapes by a wet etching method to form the fourth transparent conductive layer 106G.

Next, the partition wall 137 is formed to cover end portions of the island-shaped lower electrode and the island-shaped transparent conductive layer. The partition wall 137 includes an opening overlapping with the lower electrode. The transparent conductive layer exposed by the opening functions as part of the lower electrode of the light-emitting element.

In the first step, an alloy film of silver, palladium, and copper is used as the lower electrode. As the transparent conductive layer, an ITSO film is used. As the partition wall 137, a polyimide resin is used.

Note that transistors may be formed over the substrate 102 before the first step. The transistors may be electrically connected to the lower electrodes (the first lower electrode 104B, the second lower electrode 104Y, the third lower electrode 104R, and the fourth lower electrode 104G).

<Second Step>

Figure 14B:
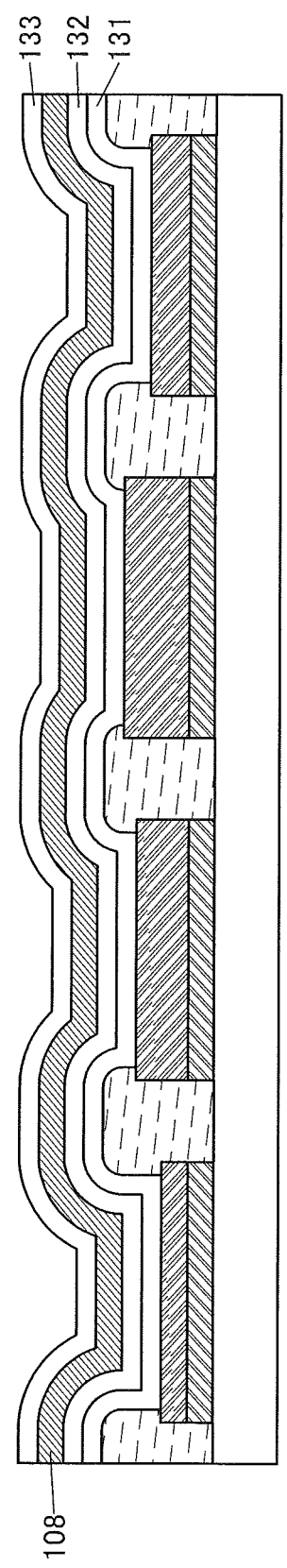

The second step is a step for forming the hole-injection layer 131, the hole-transport layer 132, the first light-emitting layer 108, and the electron-transport layer 133 (see FIG. 14B).

The hole-injection layer 131 can be formed by co-evaporating a hole-transport material and a material containing an acceptor substance. Note that co-evaporation is an evaporation method in which a plurality of different substances are concurrently vaporized from their respective evaporation sources. The hole-transport layer 132 can be formed by evaporating a hole-transport material.

The first light-emitting layer 108 can be formed by evaporating a light-emitting substance that emits light of any one of green, yellow green, yellow, orange, and red. As the above-described light-emitting substance, a phosphorescent organic compound can be used. The phosphorescent organic compound may be evaporated alone or the phosphorescent organic compound mixed with another material may be evaporated. For example, the phosphorescent organic compound may be used as a guest material, and the guest material may be dispersed into a host material having a higher excitation energy than the guest material and evaporated.

The electron-transport layer 133 can be formed by evaporating a substance with a high electron-transport property.

<Third Step>

Figure 15A:
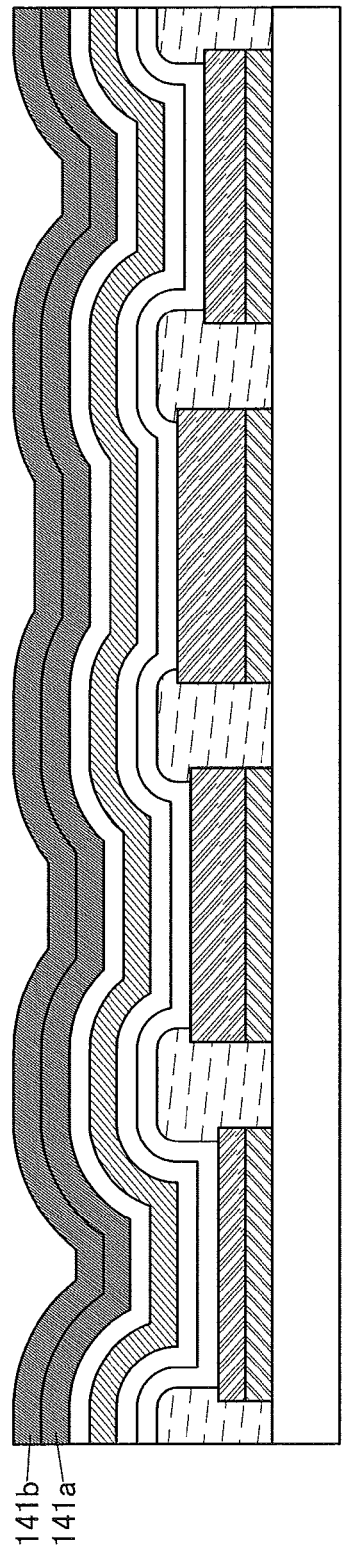
FIGS. 15A and 15B are cross-sectional views illustrating a method for manufacturing the light-emitting device.

The third step is a step for forming the charge-generation layers 141$a$ and 141$b$ (see FIG. 15A).

The charge-generation layers 141$a$ and 141$b$ can be formed by evaporating a material obtained by adding an electron acceptor (acceptor) to a hole-transport material or a material obtained by adding an electron donor (donor) to an electron-transport material. In this embodiment, a material obtained by adding an electron donor to an electron-transport material is used for the charge-generation layer 141$a$, and a material obtained by adding an electron acceptor to a hole-transport material is used for the charge-generation layer 141$b$.

<Fourth Step>

Figure 15B:
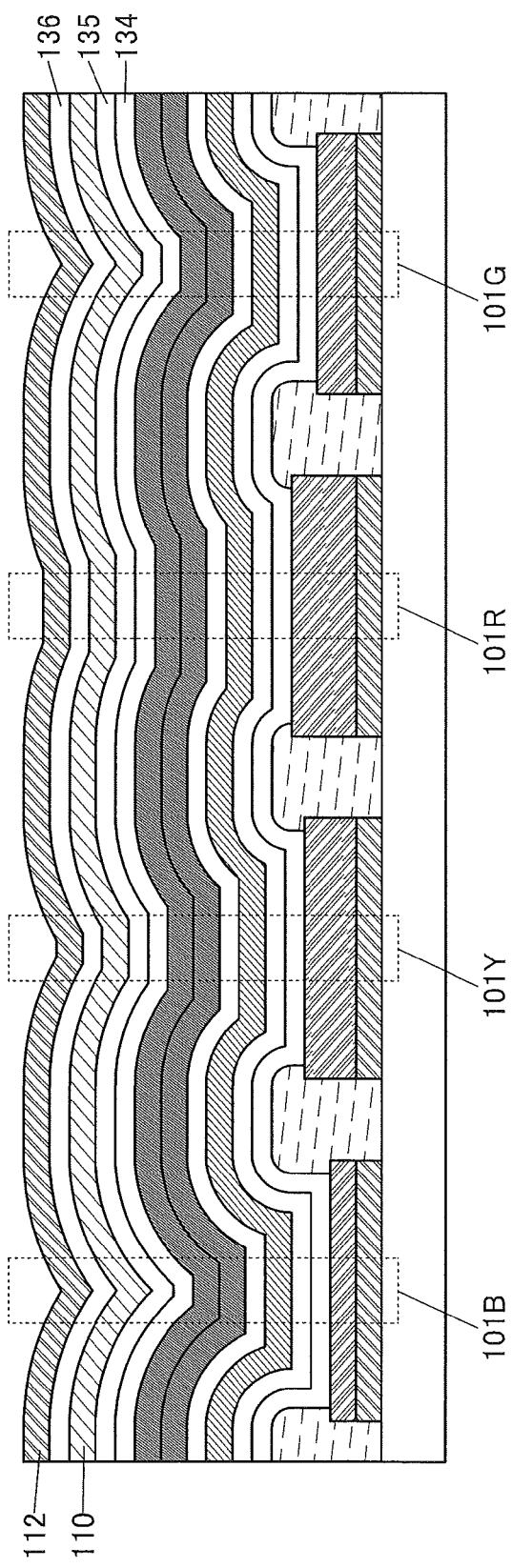

The fourth step is a step for forming the hole-injection layer 134, the hole-transport layer 135, the second light-emitting layer 110, the electron-transport layer 136, and the upper electrode 112 (see FIG. 15B).

The hole-injection layer 134 can be formed by using a material and a method which are similar to those of the hole-injection layer 131. The hole-transport layer 135 can be formed by using a material and a method which are similar to those of the hole-transport layer 132.

The second light-emitting layer 110 can be formed by evaporating a light-emitting substance that emits light of any one of violet, blue, and blue green. As the light-emitting substance, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having a higher excitation energy than the guest material and evaporated.

The electron-transport layer 136 can be formed by evaporating a substance with a high electron-transport property.

The upper electrode 112 can be formed by stacking a reflective conductive film and a light-transmitting conductive film.

Through the above-described steps, the first light-emitting element 101B, the second light-emitting element 101Y, the third light-emitting element 101R, and the fourth light-emitting element 101G are formed over the substrate 102.
<Fifth Step>

Figure 16A:
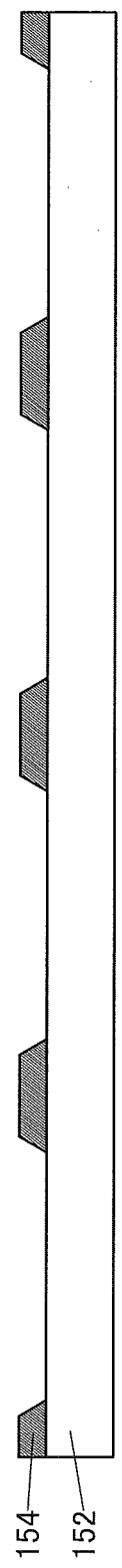
FIGS. 16A and 16B are cross-sectional views illustrating a method for manufacturing the light-emitting device.
Figure 16B:
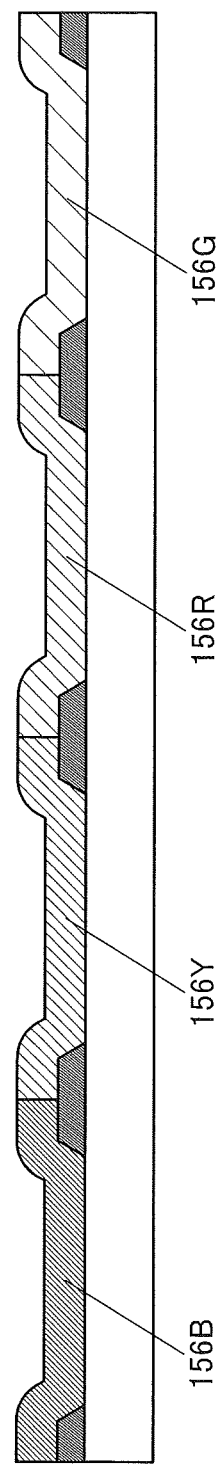

In the fifth step, the light-blocking layer 154, the first optical element 156B, the second optical element 156Y, the third optical element 156R, and the fourth optical element 156G are formed over the substrate 152 (see FIGS. 16A and 16B).

First, the light-blocking layer 154 is formed over the substrate 152 (see FIG. 16A).

In this embodiment, as the light-blocking layer 154, an organic resin film containing black pigment is formed in a desired region.

Next, the optical elements (the first optical element 156B, the second optical element 156Y, the third optical element 156R, and the fourth optical element 156G) are formed over the substrate 152 and the light-blocking layer 154 (see FIG. 16B).

In this embodiment, as the first optical element 156B, an organic resin film containing blue pigment is formed in a desired region. As the second optical element 156Y, an organic resin film containing yellow pigment is formed in a desired region. As the third optical element 156R, an organic resin film containing red pigment is formed in a desired region. As the fourth optical element 156G, an organic resin film containing green pigment is formed in a desired region.

Through the above steps, the light-blocking layer 154 and the optical elements (the first optical element 156B, the second optical element 156Y, the third optical element 156R, and the fourth optical element 156G) are formed over the substrate 152.

Note that in this embodiment, the case where the light-blocking layer 154 is formed and then the optical elements are formed is given as an example; however, without limitation thereto, the light-blocking layer 154 may be formed after the optical elements are formed, for example.
<Sixth Step>

In the sixth step, the first light-emitting element 101B, the second light-emitting element 101Y, the third light-emitting element 101R, and the fourth light-emitting element 101G formed over the substrate 102 are attached to the light-blocking layer 154, the first optical element 156B, the second optical element 156Y, the third optical element 156R, and the fourth optical element 156G formed over the substrate 152, and sealed with a sealant (not illustrated).

Through the above steps, the light-emitting device 100 illustrated in FIG. 7 can be formed.

The structure described in this embodiment can be combined with any of the structures described in the other embodiments as appropriate.

(Embodiment 2)

In this embodiment, a display device including a light-emitting device of one embodiment of the present invention will be described with reference to FIGS. 17A and 17B.

Figure 17A:
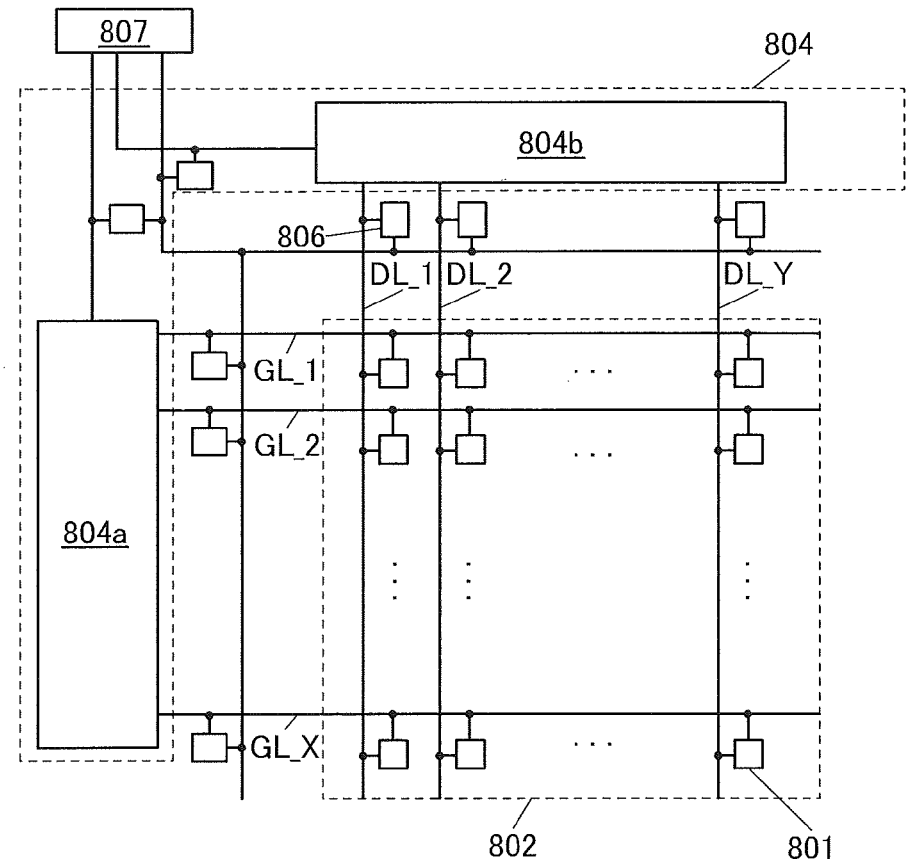
FIGS. 17A and 17B are a block diagram and a circuit diagram illustrating a display device.
Figure 17B:
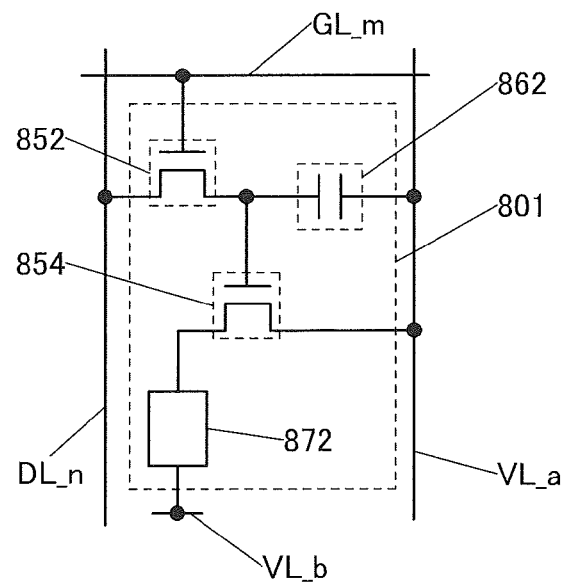

FIG. 17A is a block diagram illustrating the display device of one embodiment of the present invention, and FIG. 17B is a circuit diagram illustrating a pixel circuit of the display device of one embodiment of the present invention.

The display device illustrated in FIG. 17A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

Part or the whole of the driver circuit portion 804 is preferably formed over a substrate over which the pixel portion 802 is formed, in which case the number of components and the number of terminals can be reduced. When part or the whole of the driver circuit portion 804 is not formed over the substrate over which the pixel portion 802 is formed, the part or the whole of the driver circuit portion 804 can be mounted by chip-on-glass (COG) or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a gate driver 804a) and a circuit for supplying a signal (data signal) to drive a display element in a pixel (the circuit is hereinafter referred to as a source driver 804b).

The gate driver 804a includes a shift register or the like. Through the terminal portion 807, the gate driver 804a receives a signal for driving the shift register and outputs a signal. For example, the gate driver 804a receives a start pulse signal, a clock signal, or the like and outputs a pulse signal. The gate driver 804a has a function of controlling the potentials of wirings supplied with scan signals (such wirings are hereinafter referred to as scan lines GL_1 to GL_X). Note that a plurality of gate drivers 804a may be provided to control the scan lines GL_1 to GL_X separately. Alternatively, the gate driver 804a has a function of supplying an initialization signal. Without being limited thereto, the gate driver 804a can supply another signal.

The source driver 804b includes a shift register or the like. The source driver 804b receives a signal (video signal) from which a data signal is derived, as well as a signal for driving the shift register, through the terminal portion 807. The source driver 804b has a function of generating a data signal to be written to the pixel circuit 801 which is based on the video signal. In addition, the source driver 804b has a function of controlling output of a data signal in response to a pulse signal produced by input of a start pulse signal, a clock signal, or the like. Furthermore, the source driver 804b has a function of controlling the potentials of wirings supplied with data signals (such wirings are hereinafter referred to as data lines DL_1 to DL_Y). Alternatively, the source driver 804b has a function of supplying an initialization signal. Without being limited thereto, the source driver 804b can supply another signal.

The source driver 804b includes a plurality of analog switches or the like, for example. The source driver 804b can output, as the data signals, signals obtained by time-dividing the video signal by sequentially turning on the plurality of analog switches.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the gate driver 804a. For example, to the pixel circuit 801 in the m-th row and the n-th column (m is a natural number of less than or equal to X, and n is a natural number of less than or equal to Y), a pulse signal is input from the gate driver 804a through the scan line GL_m, and a data signal is input from the source driver 804*b* through the data line DL_n in accordance with the potential of the scan line GL_m.

The protection circuit 806 illustrated in FIG. 17A is connected to, for example, the scan line GL between the gate driver 804*a* and the pixel circuit 801. Alternatively, the protection circuit 806 is connected to the data line DL between the source driver 804*b* and the pixel circuit 801. Alternatively, the protection circuit 806 can be connected to a wiring between the gate driver 804*a* and the terminal portion 807. Alternatively, the protection circuit 806 can be connected to a wiring between the source driver 804*b* and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 17A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the gate driver 804*a* or a configuration in which the protection circuits 806 are connected to the source driver 804*b* may be employed. Alternatively, the protection circuits 806 may be configured to be connected to the terminal portion 807.

In FIG. 17A, an example in which the driver circuit portion 804 includes the gate driver 804*a* and the source driver 804*b* is shown; however, the structure is not limited thereto. For example, only the gate driver 804*a* may be formed and a separately prepared substrate where a source driver circuit is formed (e.g., a driver circuit substrate formed with a single crystal semiconductor film or a polycrystalline semiconductor film) may be mounted.

Each of the plurality of pixel circuits 801 in FIG. 17A can have a structure illustrated in FIG. 17B, for example.

The pixel circuit 801 illustrated in FIG. 17B includes transistors 852 and 854, a capacitor 862, and a light-emitting element 872.

One of a source electrode and a drain electrode of the transistor 852 is electrically connected to a wiring to which a data signal is supplied (hereinafter referred to as a data line DL_n). A gate electrode of the transistor 852 is electrically connected to a wiring to which a gate signal is supplied (hereinafter referred to as a scan line GL_m).

The transistor 852 has a function of controlling whether to write a data signal by being turned on or off.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiment 1 can be used.

Note that a high power supply potential VDD is supplied to one of the potential supply line VL_a and the potential supply line VL_b, and a low power supply potential VSS is supplied to the other.

In the display device including the pixel circuits 801 in FIG. 17B, the pixel circuits 801 are sequentially selected row by row by the gate driver 804*a* in FIG. 17A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 18A and 18B and FIGS. 19A and 19B illustrate examples of the pixel circuit.

Figure 18A:
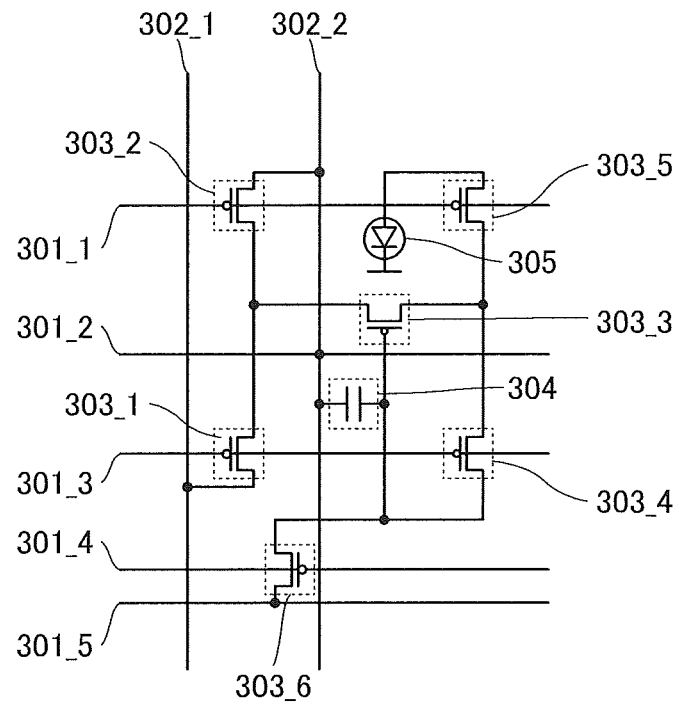
FIGS. 18A and 18B are each a circuit diagram illustrating a pixel circuit of a display device.

The pixel circuit illustrated in FIG. 18A includes six transistors (transistors 303_1 to 303_6), a capacitor 304, and a light-emitting element 305. The pixel circuit illustrated in FIG. 18A is electrically connected to wirings 301_1 to 301_5 and wirings 302_1 and 302_2. Note that as the transistors 303_1 to 3036, for example, p-channel transistors can be used.

Figure 18B:
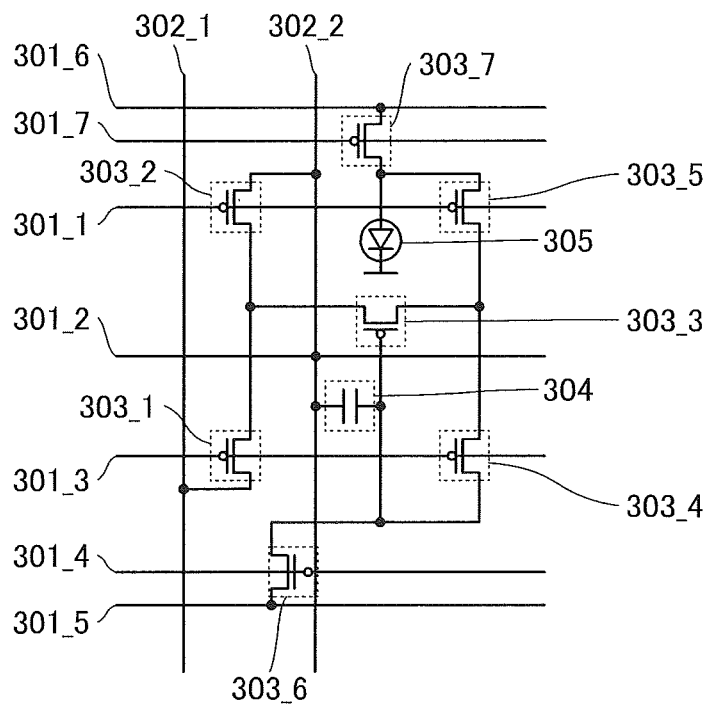

The pixel circuit illustrated in FIG. 18B has a configuration in which a transistor 303_7 is added to the pixel circuit illustrated in FIG. 18A. The pixel circuit illustrated in FIG. 18B is electrically connected to wirings 301_6 and 301_7. The wirings 301_5 and 301_6 may be electrically connected to each other. Note that as the transistor 303_7, for example, a p-channel transistor can be used.

Figure 19A:
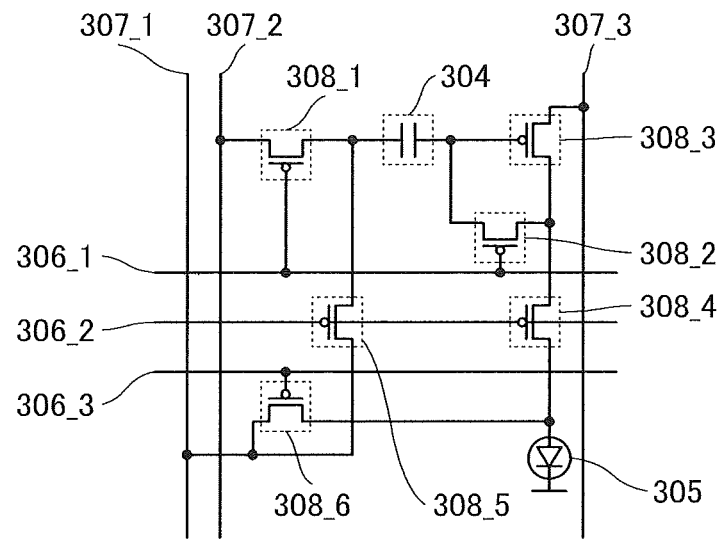
FIGS. 19A and 19B are each a circuit diagram illustrating a pixel circuit of a display device.

The pixel circuit illustrated in FIG. 19A includes six transistors (transistors 308_1 to 308_6), the capacitor 304, and the light-emitting element 305. The pixel circuit illustrated in FIG. 19A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 19B:
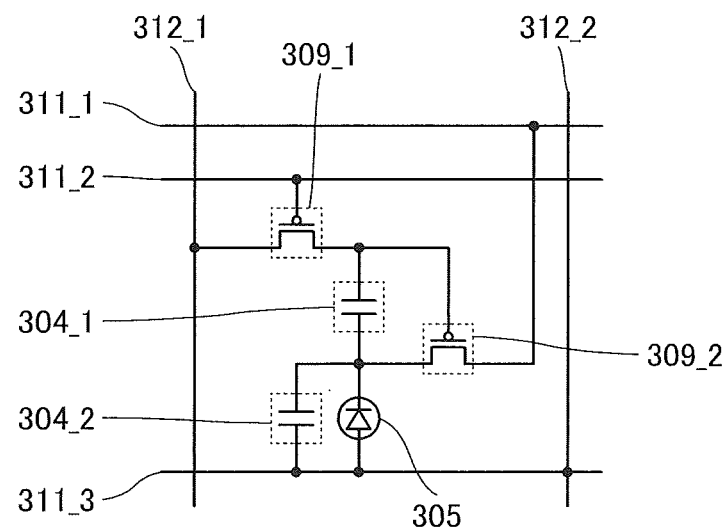

The pixel circuit illustrated in FIG. 19B includes two transistors (transistors 309_1 and 309_2), two capacitors (capacitors 304_1 and 304_2), and the light-emitting element 305. The pixel circuit illustrated in FIG. 19B is electrically connected to wirings 311_1 to 311_3 and wirings 312_1 and 312_2. With the configuration of the pixel circuit illustrated in FIG. 19B, the light-emitting element 305 can be driven by constant voltage constant current (CVCC). Note that as the transistors 309_1 and 309_2, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments as appropriate.

(Embodiment 3)

In this embodiment, a display panel including a light-emitting device of one embodiment of the present invention and an electronic device in which the display panel is provided with an input device will be described with reference to FIGS. 20A and 20B, FIGS. 21A to 21C, FIGS. 22A and 22B, FIGS. 23A and 23B, and FIG. 24.

<Description 1 of Touch Panel>

In this embodiment, a touch panel 2000 including a display panel and an input device will be described as an example of an electronic device. In addition, an example in which a touch sensor is used as an input device will be described. Note that a light-emitting device of one embodiment of the present invention can be used for a pixel of the display panel.

Figure 20A:
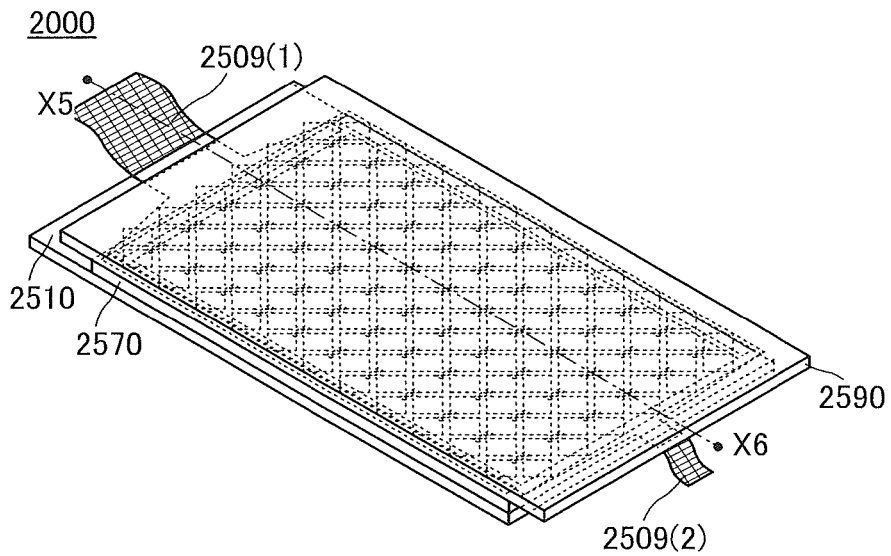
FIGS. 20A and 20B are perspective views of an example of a touch panel.
Figure 20B:
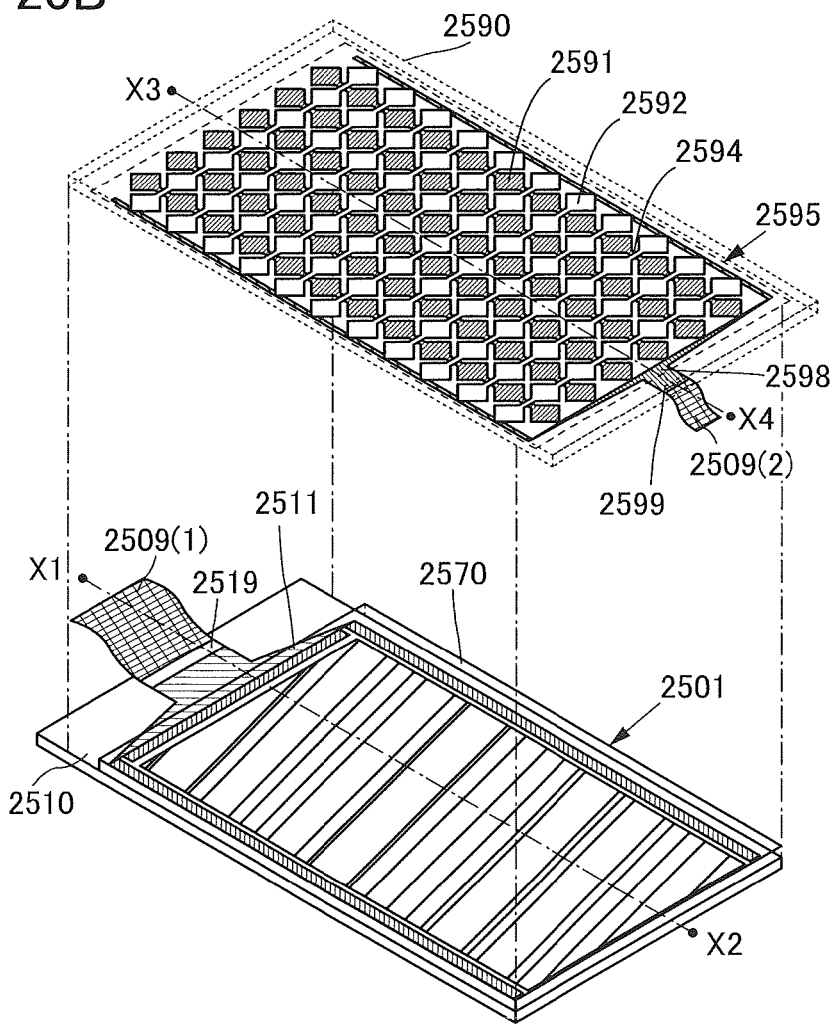

FIGS. 20A and 20B are perspective views of the touch panel 2000. Note that FIGS. 20A and 20B illustrate only main components of the touch panel 2000 for simplicity.

The touch panel 2000 includes a display panel 2501 and a touch sensor 2595 (see FIG. 20B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display panel 2501 includes a plurality of pixels over the substrate 2510 and a plurality of wirings 2511 through which signals are supplied to the pixels. The plurality of wirings 2511 are led to an outer portion of the substrate 2510, and part of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to an outer portion of the substrate 2590, and part of the plurality of wirings 2598 form a terminal. The terminal is electrically connected to an FPC 2509(2). Note that in FIG. 20B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor include a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 20B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 20A and 20B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that for example, a transparent conductive film including indium oxide, tin oxide, zinc oxide, or the like (e.g., a film of ITO) can be given as a material of conductive films used for the electrode 2591, the electrode 2592, and the wiring 2598, i.e., wirings and electrodes in the touch panel. Moreover, for example, a low-resistance material is preferably used as the material of the wiring and the electrode in the touch panel. For example, silver, copper, aluminum, a carbon nanotube, graphene, a metal halide (such as a silver halide), or the like may be used. Alternatively, a metal nanowire including a plurality of conductors with an extremely small width (e.g., a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. For example, in the case of using an Ag nanowire for the wiring and the electrode in the touch panel, a visible light transmittance of 89% or more and a sheet resistance of 40 $\Omega$/sq. or more and 100 $\Omega$/sq. or less can be achieved. A metal nanowire, a metal mesh, a carbon nanotube, graphene, and the like, which are examples of a material that can be used for the above-described wiring and electrode in the touch panel, have a high visible light transmittance; therefore, they may be used for an electrode of a display element (e.g., a pixel electrode or a common electrode).

<Display Panel>

Figure 21A:
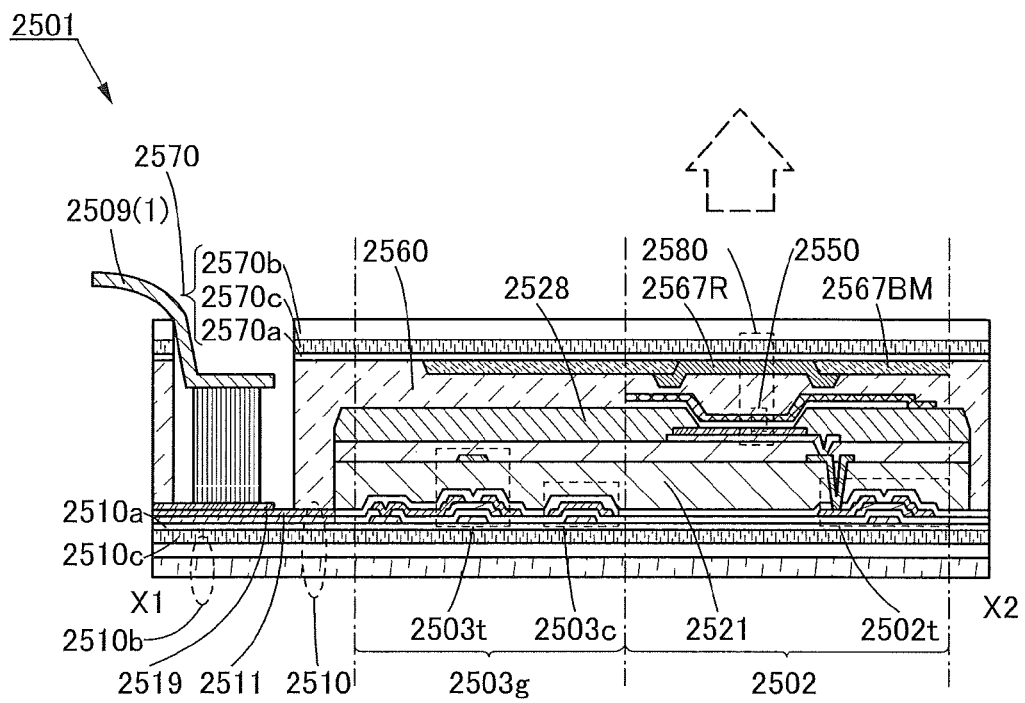
FIGS. 21A to 21C are cross-sectional views of examples of a display panel and a touch sensor.

Next, the display panel 2501 is described in detail with reference to FIG. 21A. FIG. 21A is a cross-sectional view along dashed-dotted line X1-X2 in FIG. 20B.

The display panel 2501 includes a plurality of pixels arranged in a matrix. Each of the pixels includes a display element and a pixel circuit for driving the display element.

For the substrate 2510 and the substrate 2570, for example, a flexible material with a vapor permeability lower than or equal to $10^{-5}$ g/(m$^2$·day), preferably lower than or equal to $1 \times 10^{-6}$ g/(m$^2$·day) can be preferably used. Alternatively, materials whose thermal expansion coefficients are substantially equal to each other are preferably used for the substrate 2510 and the substrate 2570. For example, the coefficients of linear expansion of the materials are preferably lower than or equal to $1 \times 10^{-3}$/K, further preferably lower than or equal to $5 \times 10^{-5}$/K and still further preferably lower than or equal to $1 \times 10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon or aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 21A, the sealing layer 2560 can also serve as an optical element.

A sealant may be formed in the outer portion of the sealing layer 2560. With the use of the sealant, a light-emitting element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display panel 2501 includes a pixel 2502. The pixel 2502 includes a light-emitting module 2580.

The pixel 2502 includes the light-emitting element 2550 and a transistor 2502t that can supply electric power to the light-emitting element 2550. Note that the transistor 2502t functions as part of the pixel circuit. The light-emitting module 2580 includes the light-emitting element 2550 and a coloring layer 2567R.

The light-emitting element 2550 includes a lower electrode, an upper electrode, and an EL layer between the lower electrode and the upper electrode. As the light-emitting element 2550, any of the light-emitting elements described in Embodiment 1 can be used, for example. Note that although only one light-emitting element 2550 is illustrated in FIG. 21A, it is possible to employ the structure with two or more kinds of light-emitting elements as described in Embodiment 1.

In the case where the sealing layer 2560 is provided on the light extraction side, the sealing layer 2560 is in contact with the light-emitting element 2550 and the coloring layer 2567R.

The coloring layer 2567R is provided to overlap with the light-emitting element 2550. Accordingly, part of light emitted from the light-emitting element 2550 passes through the coloring layer 2567R and is emitted to the outside of the light-emitting module 2580 as indicated by an arrow in FIG. 21A.

The display panel 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an ink-jet method, an etching method using a photolithography technique, or the like.

An insulating layer 2521 is provided in the display panel 2501. The insulating layer 2521 covers the transistor 2502t. Note that the insulating layer 2521 has a function of planarizing unevenness caused by the pixel circuit. The insulating layer 2521 may have a function of suppressing impurity diffusion. This can prevent the reliability of the transistor 2502t or the like from being lowered by impurity diffusion.

The light-emitting element 2550 is formed over the insulating layer 2521. A partition wall 2528 is provided so as to overlap with an end portion of the lower electrode of the light-emitting element 2550. Note that a spacer for controlling the distance between the substrate 2510 and the substrate 2570 may be formed over the partition wall 2528.

A scan line driver circuit 2503g includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wiring 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 21B:
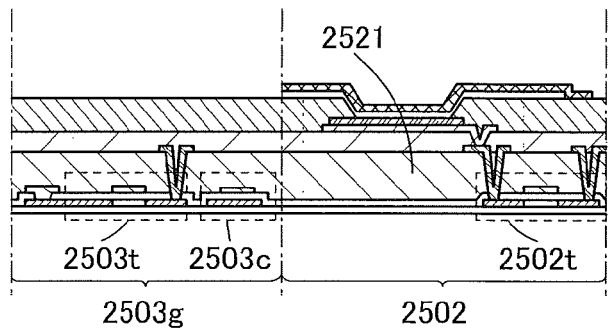

In the display panel 2501, transistors with any of a variety of structures can be used. FIG. 21A illustrates an example of using bottom-gate transistors; however, the present invention is not limited to this example, and top-gate transistors may be used in the display panel 2501 as illustrated in FIG. 21B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), organic semiconductors, and the like. It is preferable to use an oxide semiconductor that has an energy gap of 2 eV or more, preferably 2.5 eV or more and further preferably 3 eV or more, for one of the transistors 2502*t* and 2503*t* or both, in which case the off-state current of the transistors can be reduced. Examples of the oxide semiconductors include an In—Ga oxide, an In-M-Zn oxide (M represents Al, Ga, Y, Zr, La, Ce, Sn, or Nd), and the like.

<Touch Sensor>

Figure 21C:
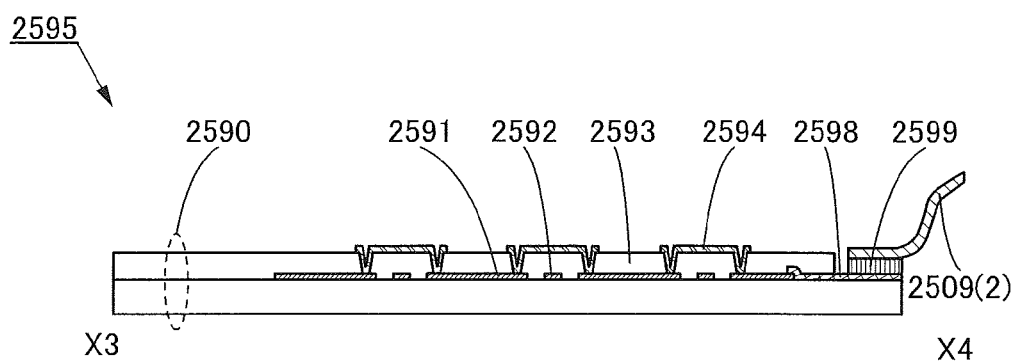

Next, the touch sensor 2595 is described in detail with reference to FIG. 21C. FIG. 21C is a cross-sectional view along dashed-dotted line X3-X4 in FIG. 20B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be preferably used as the wiring 2594 because the aperture ratio of the touch panel can be increased. Moreover, a material with higher conductivity than the conductivities of the electrodes 2591 and 2592 can be preferably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 22A:
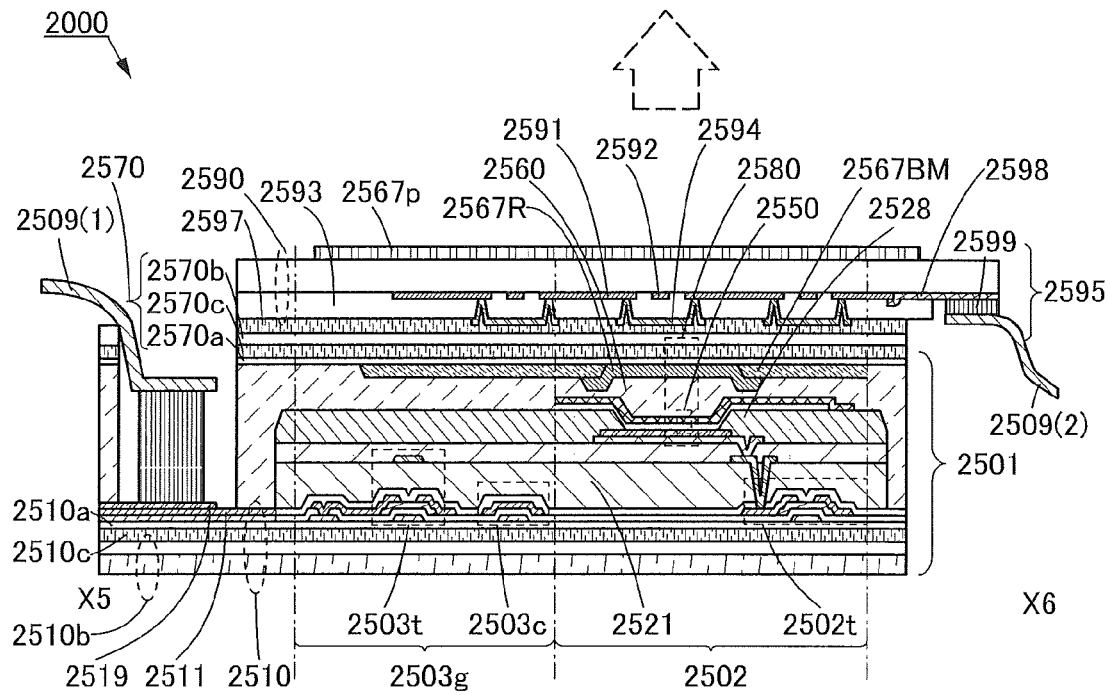
FIGS. 22A and 22B are each a cross-sectional view of an example of a touch panel.

Next, the touch panel 2000 is described in detail with reference to FIG. 22A. FIG. 22A is a cross-sectional view along dashed-dotted line X5-X6 in FIG. 20A.

In the touch panel 2000 illustrated in FIG. 22A, the display panel 2501 described with reference to FIG. 21A and the touch sensor 2595 described with reference to FIG. 21C are attached to each other.

The touch panel 2000 illustrated in FIG. 22A includes an adhesive layer 2597 and an anti-reflective layer 2567*p* in addition to the components described with reference to FIGS. 21A and 21C.

The adhesive layer 2597 is provided in contact with the wiring 2594. Note that the adhesive layer 2597 attaches the substrate 2590 to the substrate 2570 so that the touch sensor 2595 overlaps with the display panel 2501. The adhesive layer 2597 preferably has a light-transmitting property. A heat curable resin or an ultraviolet curable resin can be used for the adhesive layer 2597. For example, an acrylic resin, an urethane-based resin, an epoxy-based resin, or a siloxane-based resin can be used.

The anti-reflective layer 2567*p* is provided to overlap with pixels. As the anti-reflective layer 2567*p*, a circularly polarizing plate can be used, for example.

Next, a touch panel having a structure different from that illustrated in FIG. 22A is described with reference to FIG. 22B.

Figure 22B:
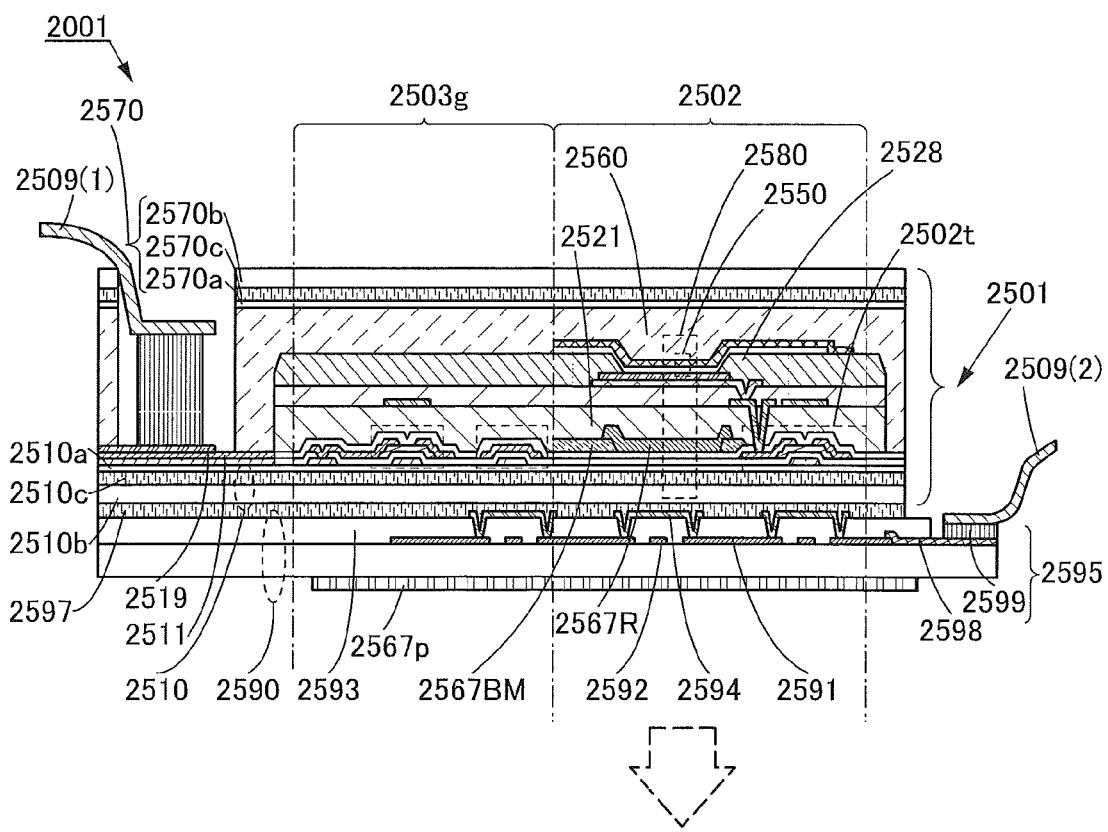

FIG. 22B is a cross-sectional view of a touch panel 2001. The touch panel 2001 illustrated in FIG. 22B differs from the touch panel 2000 illustrated in FIG. 22A in the position of the touch sensor 2595 relative to the display panel 2501. Different parts are described in detail below, and the above description of the touch panel 2000 is referred to for the other similar parts.

The coloring layer 2567R is provided to overlap with the light-emitting element 2550. The light-emitting element 2550 illustrated in FIG. 22B emits light to the side where the transistor 2502*t* is provided. Accordingly, part of light emitted from the light-emitting element 2550 passes through the coloring layer 2567R and is emitted to the outside of the light-emitting module 2580 as indicated by an arrow in FIG. 22B.

The touch sensor 2595 is provided on the substrate 2510 side of the display panel 2501.

The adhesive layer 2597 is provided between the substrate 2510 and the substrate 2590 and attaches the touch sensor 2595 to the display panel 2501.

As illustrated in FIG. 22A or 22B, light may be emitted from the light-emitting element to one of upper and lower sides, or both, of the substrate.

<Method for Driving Touch Panel>

Next, an example of a method for driving a touch panel is described with reference to FIGS. 23A and 23B.

Figure 23A:
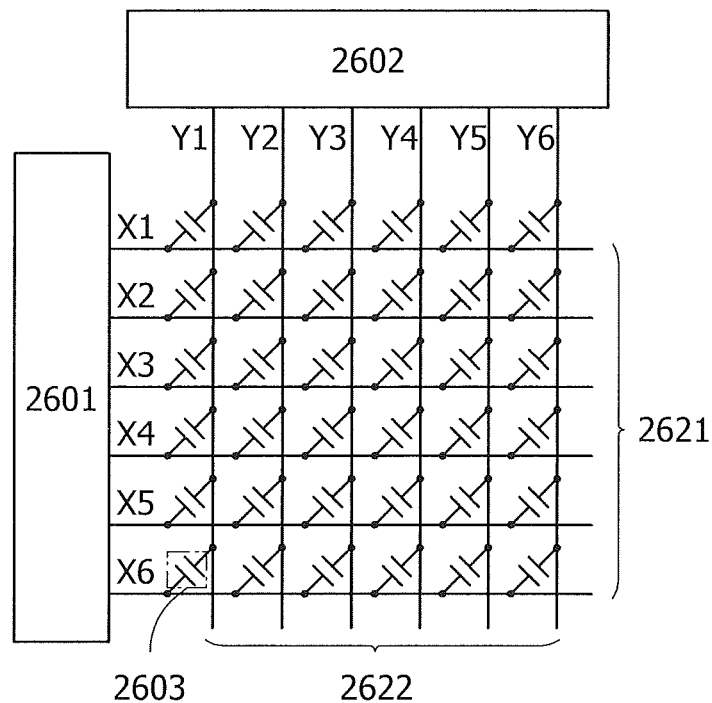
FIGS. 23A and 23B are a block diagram and a timing chart of a touch sensor.

FIG. 23A is a block diagram illustrating the structure of a mutual capacitive touch sensor. FIG. 23A illustrates a pulse voltage output circuit 2601 and a current sensing circuit 2602. Note that in FIG. 23A, six wirings X1 to X6 represent the electrodes 2621 to which a pulse voltage is applied, and six wirings Y1 to Y6 represent the electrodes 2622 that detect changes in current. FIG. 23A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for detection of current values.

Figure 23B:
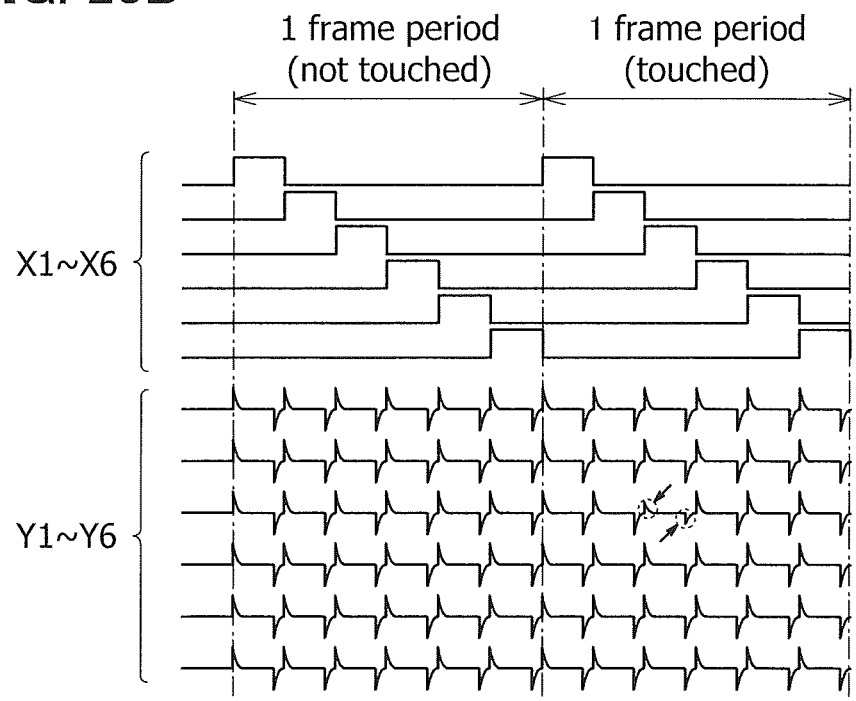

FIG. 23B is a timing chart showing input and output waveforms in the mutual capacitive touch sensor illustrated in FIG. 23A. In FIG. 23B, sensing of a sensing target is performed in all the rows and columns in one frame period. FIG. 23B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage level changes.

By detecting a change in mutual capacitance in this manner, proximity or contact of a sensing target can be sensed.

<Sensor Circuit>

Figure 24:
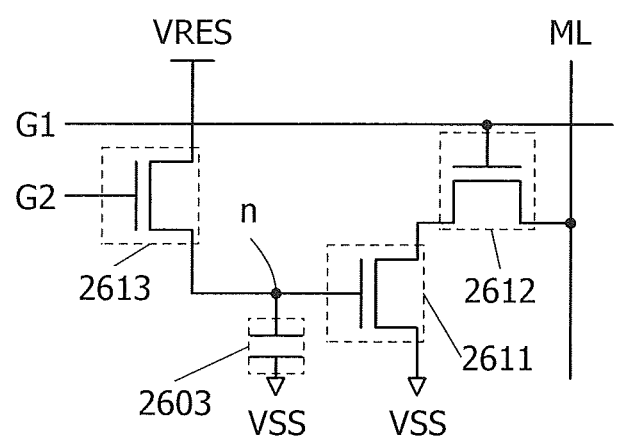
FIG. 24 is a circuit diagram of a touch sensor.

Although FIG. 23A illustrates a passive type touch sensor in which only the capacitor 2603 is provided at the intersection of wirings as a touch sensor, an active type touch sensor including a transistor and a capacitor may be used. FIG. 24 illustrates an example of a sensor circuit included in an active type touch sensor.

The sensor circuit in FIG. 24 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 24 is described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be combined with any of the structures described in the other embodiments as appropriate.

(Embodiment 4)

In this embodiment, a display module and electronic devices including a light-emitting device of one embodiment of the present invention will be described with reference to FIG. 25 and FIGS. 26A to 26G.

Figure 25:
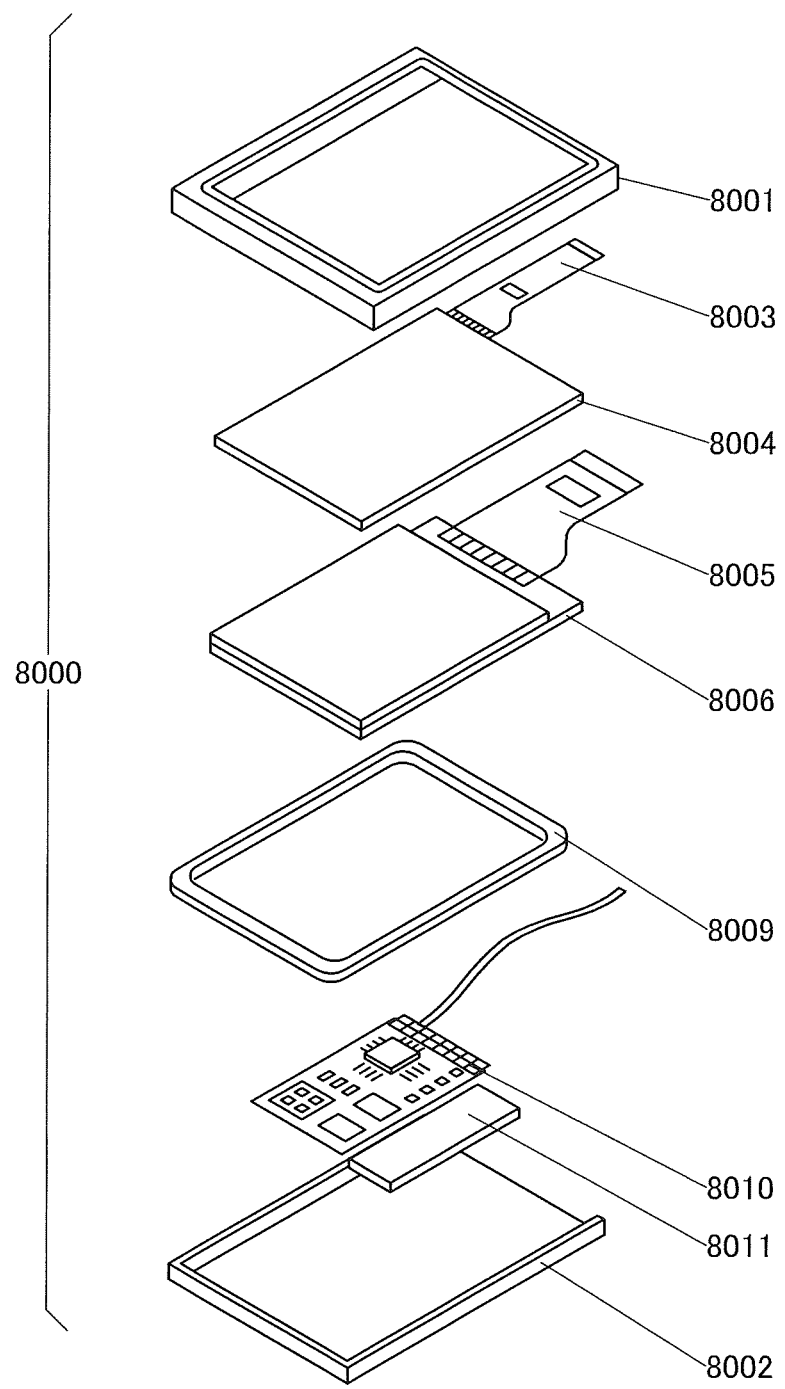
FIG. 25 is a perspective view of a display module.

In a display module 8000 illustrated in FIG. 25, a touch sensor 8004 connected to an FPC 8003, a display panel 8006 connected to an FPC 8005, a frame 8009, a printed board 8010, and a battery 8011 are provided between an upper cover 8001 and a lower cover 8002.

The light-emitting device of one embodiment of the present invention can be used for the display panel 8006, for example.

The shapes and sizes of the upper cover 8001 and the lower cover 8002 can be changed as appropriate in accordance with the sizes of the touch sensor 8004 and the display panel 8006.

The touch sensor 8004 can be a resistive touch sensor or a capacitive touch sensor and may be formed to overlap with the display panel 8006. A counter substrate (sealing substrate) of the display panel 8006 can have a touch sensor function. A photosensor may be provided in each pixel of the display panel 8006 so that an optical touch sensor is obtained.

The frame 8009 protects the display panel 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

FIGS. 26A to 26G illustrate electronic devices. These electronic devices can include a housing 9000, a display portion 9001, a speaker 9003, operation keys 9005, a connection terminal 9006, a sensor 9007, a microphone 9008, and the like.

The electronic devices illustrated in FIGS. 26A to 26G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 26A to 26G are not limited to those described above, and the electronic devices can have a variety of functions. Although not illustrated in FIGS. 26A to 26G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 26A to 26G are described in detail below.

Figure 26A:
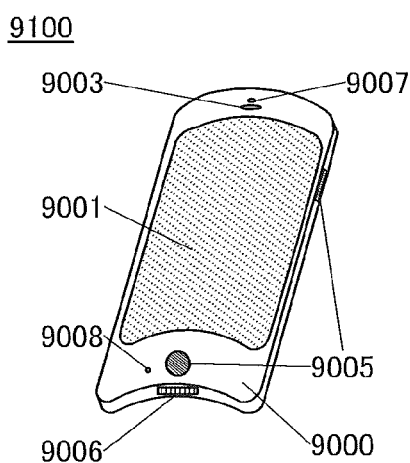
FIGS. 26A to 26G illustrate electronic devices.

FIG. 26A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 26D:
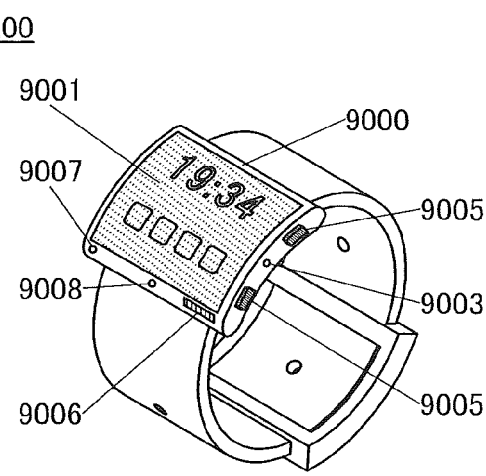
Figure 26B:
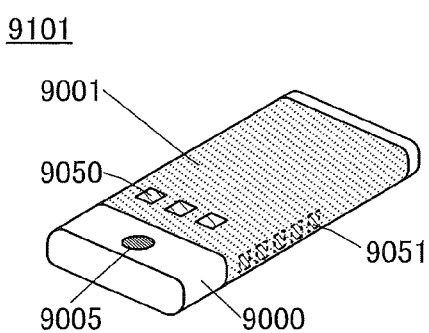

FIG. 26B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 26B, can be positioned in the portable information terminal 9101 as in the portable information terminal 9100 shown in FIG. 26A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 26E:
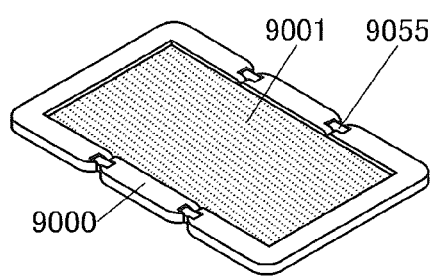
Figure 26C:
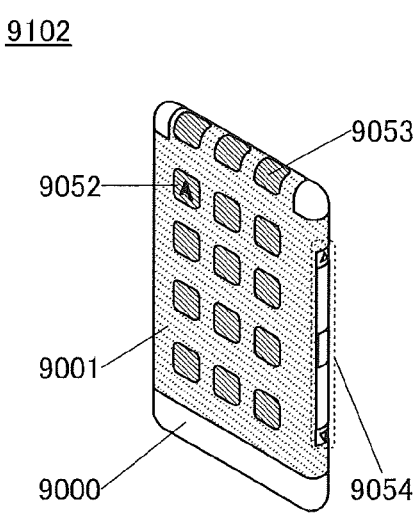

FIG. 26C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 26D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ short-distance wireless communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 26F:
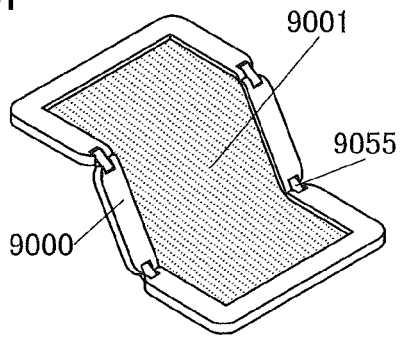
Figure 26G:
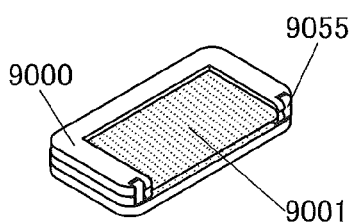

FIGS. 26E, 26F, and 26G are perspective views of a foldable portable information terminal 9201. FIG. 26E is a perspective view illustrating the portable information terminal 9201 that is opened. FIG. 26F is a perspective view illustrating the portable information terminal 9201 that is being opened or being folded. FIG. 26G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic devices described in this embodiment each include the display portion for displaying some sort of data. Note that the light-emitting device of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is inflexible and display is performed on a plane portion may be employed.

The structure described in this embodiment can be combined with any of the structures described in the other embodiments as appropriate.

(Embodiment 5)

In this embodiment, the light-emitting device of one embodiment of the present invention will be described with reference to FIGS. 27A to 27C.

Figure 27A:
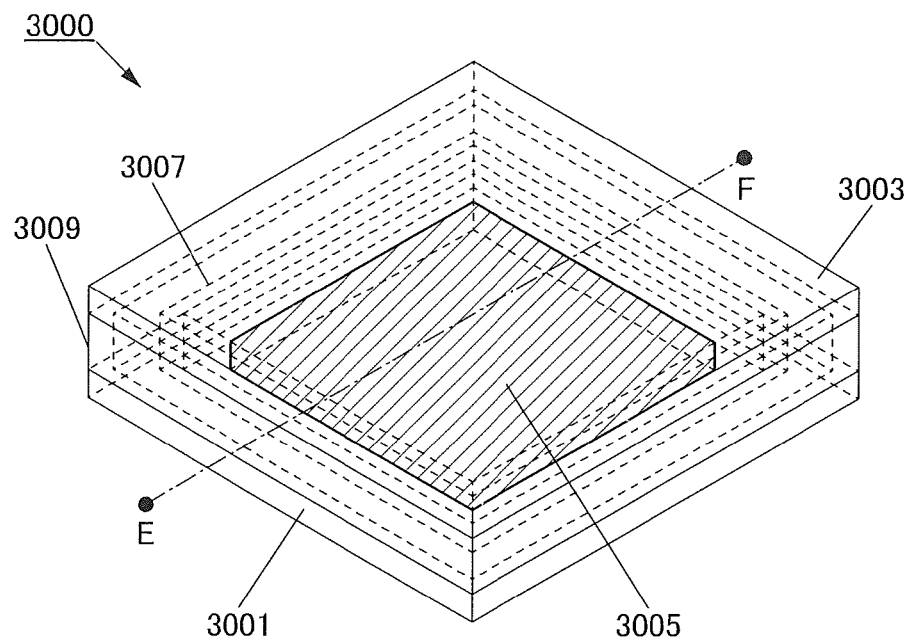
FIGS. 27A to 27C are a perspective view and cross-sectional views illustrating a light-emitting device.
Figure 27B:
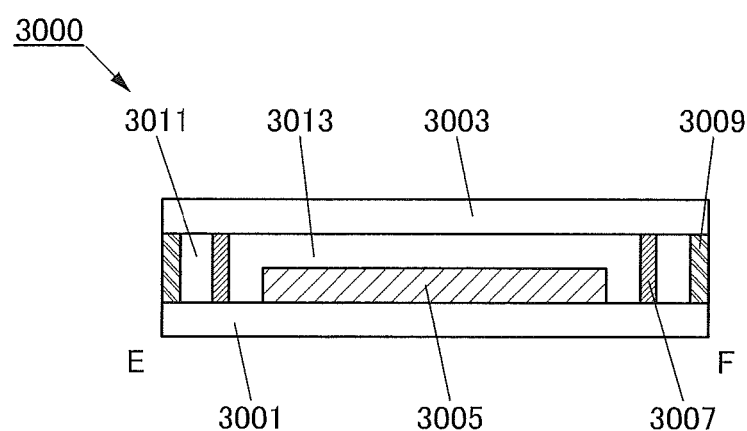

FIG. 27A is a perspective view of a light-emitting device 3000 shown in this embodiment, and FIG. 27B is a cross-sectional view along dashed-dotted line E-F in FIG. 27A. Note that in FIG. 27A, some components are illustrated by broken lines in order to avoid complexity of the drawing.

The light-emitting device 3000 illustrated in FIGS. 27A and 27B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 27A and 27B, a structure in which light is emitted from the light-emitting element 3005 to the lower side (the substrate 3001 side) is illustrated.

As illustrated in FIGS. 27A and 27B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be preferably suppressed. Note that it is not necessary to provide both the first sealing region 3007 and the second sealing region 3009. For example, only the first sealing region 3007 may be provided.

Note that in FIG. 27B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 102 and the substrate 152 described in Embodiment 1, respectively. The light-emitting element 3005 can have a structure similar to that of any of the first to third light-emitting elements described in Embodiment 1.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass fit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, materials that include polyester, polyolefin, polyamide (e.g., nylon or aramid), polyimide, polycarbonate, polyurethane, an acrylic resin, an epoxy resin, or a resin having a siloxane bond can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second region 3009 is sealed using the material containing glass, whereby the light-emitting device 3000 is less likely to be damaged even when distortion due to external force or the like is generated.

Furthermore, as illustrated in FIG. 27B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Note that for the first region 3011 and the second region 3013, a reduced pressure state is preferred to an atmospheric pressure state.

Figure 27C:
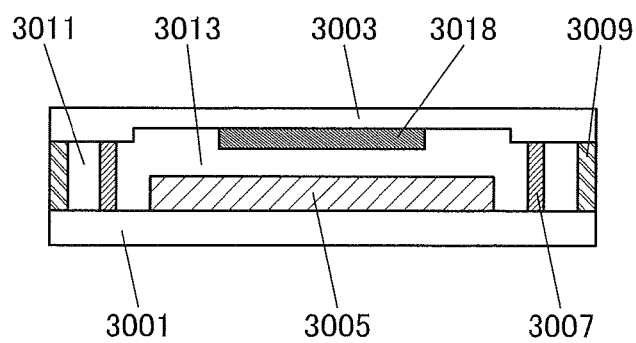

FIG. 27C illustrates a modification example of the structure in FIG. 27B. FIG. 27C is a cross-sectional view illustrating the modification example of the light-emitting device 3000.

FIG. 27C illustrates a structure in which a desiccant 3018 is provided in a recessed portion provided in part of the substrate 3003. The other components are the same as those of the structure illustrated in FIG. 27B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 27B are described with reference to FIGS. 28A to 28D. Note that FIGS. 28A to 28D are cross-sectional views illustrating the modification examples of the light-emitting device 3000 illustrated in FIG. 27B.

Figure 28A:
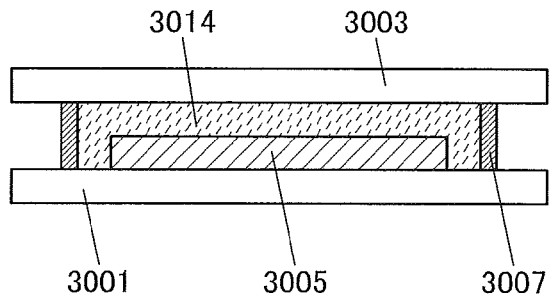
FIGS. 28A to 28D are cross-sectional views illustrating a light-emitting device.

In the light-emitting device illustrated in FIG. 28A, the second sealing region 3009 is not provided but only the first sealing region 3007 is provided. Moreover, in the light-emitting device illustrated in FIG. 28A, a region 3014 is provided instead of the second region 3013 illustrated in FIG. 27B.

For the region 3014, for example, materials that include polyester, polyolefin, polyamide (e.g., nylon or aramid), polyimide, polycarbonate, polyurethane, an acrylic resin, an epoxy resin, or a resin having a siloxane bond can be used.

When the above-described material is used for the region 3014, what is called a solid-sealing light-emitting device can be obtained.

Figure 28B:
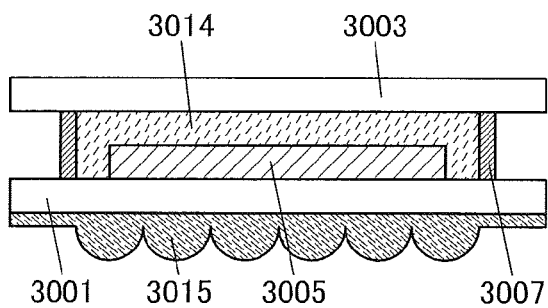

In the light-emitting device illustrated in FIG. 28B, a substrate 3015 is provided on the substrate 3001 side of the light-emitting device illustrated in FIG. 28A.

The substrate 3015 has unevenness as illustrated in FIG. 28B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 28B, a substrate having a function as a diffusion plate may be provided.

Figure 28C:
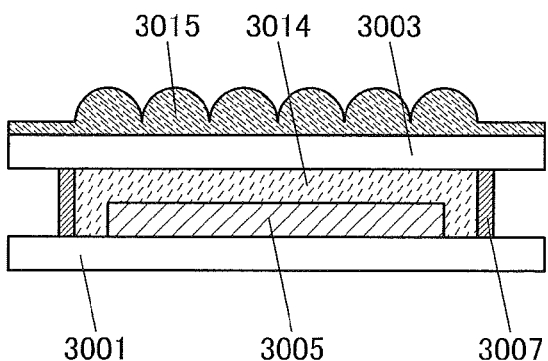

In the light-emitting device illustrated in FIG. 28C, light is extracted through the substrate 3003 side, unlike in the light-emitting device illustrated in FIG. 28A, in which light is extracted through the substrate 3001 side.

The light-emitting device illustrated in FIG. 28C includes the substrate 3015 on the substrate 3003 side. The other components are the same as those of the light-emitting device illustrated in FIG. 28B.

Figure 28D:
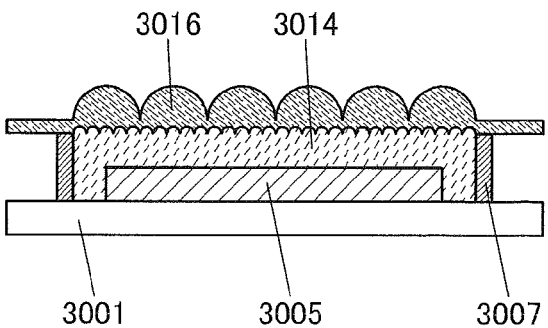

In the light-emitting device illustrated in FIG. 28D, the substrate 3003 and the substrate 3015 included in the light-emitting device illustrated in FIG. 28C are not provided but a substrate 3016 is provided.

The substrate 3016 includes first unevenness positioned closer to the light-emitting element 3005 and second unevenness positioned farther from the light-emitting element 3005. With the structure illustrated in FIG. 28D, the efficiency of extraction of light from the light-emitting element 3005 can be further improved.

Thus, the use of the structure described in this embodiment can obtain a light-emitting device in which deterioration of a light-emitting element due to impurities such as moisture and oxygen is suppressed. Alternatively, with the structure described in this embodiment, a light-emitting device having high light extraction efficiency can be obtained.

The structure described in this embodiment can be combined with any of the structures described in the other embodiments as appropriate.

(Embodiment 6)

In this embodiment, examples in which the light-emitting device of one embodiment of the present invention is applied to various lighting devices and electronic devices will be described with reference to FIGS. 29A to 29C.

An electronic device or a lighting device that has a light-emitting region with a curved surface can be obtained with the use of the light-emitting device of one embodiment of the present invention which is manufactured over a substrate having flexibility.

Furthermore, a light-emitting device to which one embodiment of the present invention is applied can also be applied to lighting for motor vehicles, examples of which are lighting for a dashboard, a windshield, a ceiling, and the like.

Figure 29A:
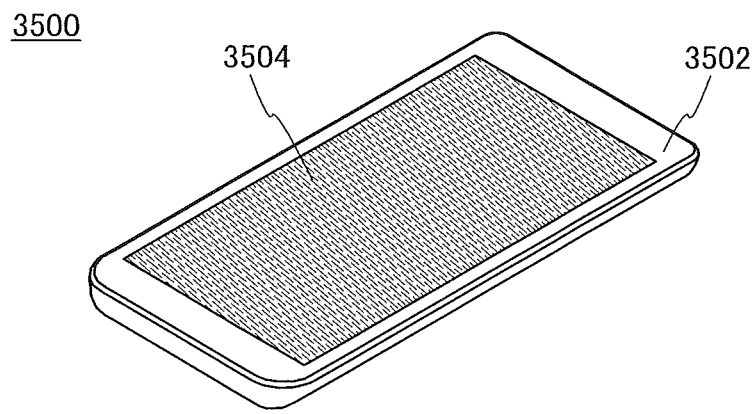
FIGS. 29A to 29C illustrate a lighting device and an electronic device.
Figure 29B:
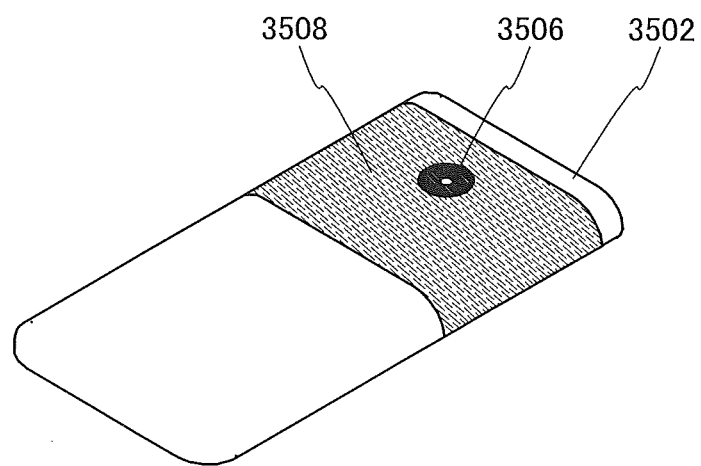

FIG. 29A is a perspective view illustrating one surface of a multifunction terminal 3500, and FIG. 29B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 29A and 29B can have a variety of functions as in the electronic devices illustrated in FIGS. 26A to 26G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 29C:
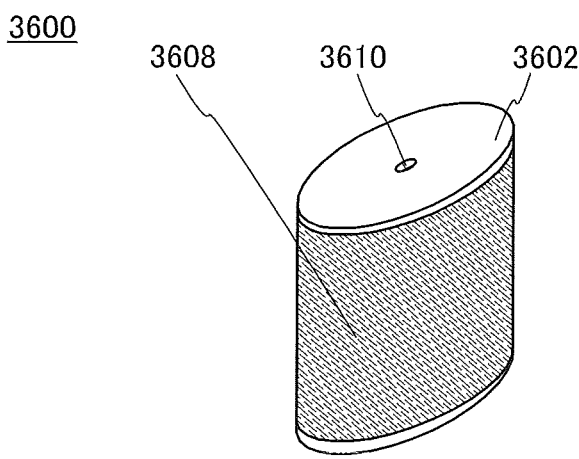

FIG. 29C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently plural times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be combined with any of the structures described in the other embodiments as appropriate.

This application is based on Japanese Patent Application serial no. 2014-216875 filed with Japan Patent Office on Oct. 24, 2014, the entire contents of which are hereby incorporated by reference.

What is claimed is:

1. A light-emitting device comprising:
a first light-emitting element comprising:
a first lower electrode;
a first transparent conductive layer over the first lower electrode;
a first light-emitting layer over the first transparent conductive layer;
a charge-generation layer over the first light-emitting layer;
a second light-emitting layer over the charge-generation layer; and
an upper electrode over the second light-emitting layer,
a second light-emitting element comprising:
a second lower electrode;
a second transparent conductive layer over the second lower electrode;
the first light-emitting layer over the second transparent conductive layer;
the charge-generation layer over the first light-emitting layer;
the second light-emitting layer over the charge-generation layer; and
the upper electrode over the second light-emitting layer,
a third light-emitting element comprising:
a third lower electrode;
a third transparent conductive layer over the third lower electrode;
the first light-emitting layer over the third transparent conductive layer;
the charge-generation layer over the first light-emitting layer;
the second light-emitting layer over the charge-generation layer; and
the upper electrode over the second light-emitting layer, and
a fourth light-emitting element comprising:
a fourth lower electrode;
a fourth transparent conductive layer over the fourth lower electrode;
the first light-emitting layer over the fourth transparent conductive layer;
the charge-generation layer over the first light-emitting layer;
the second light-emitting layer over the charge-generation layer; and
the upper electrode over the second light-emitting layer,
wherein light emitted from the first light-emitting element has at least one peak in a wavelength range of greater than or equal to 400 nm and less than 480 nm,
wherein light emitted from the second light-emitting element has at least one peak in a wavelength range of greater than or equal to 550 nm and less than 600 nm,
wherein light emitted from the third light-emitting element has at least one peak in a wavelength range of greater than or equal to 600 nm and less than or equal to 740 nm, and
wherein light emitted from the fourth light-emitting element has at least one peak in a wavelength range of greater than or equal to 480 nm and less than 550 nm.

2. The light-emitting device according to claim 1, wherein the first lower electrode, the second lower electrode, the third lower electrode, and the fourth lower electrode each comprise silver.

3. The light-emitting device according to claim 1,
wherein the first light-emitting layer includes a phosphorescent material, and
wherein the second light-emitting layer includes a fluorescent material.

4. An electronic device comprising:
the light-emitting device according to claim 1; and
a housing or a touch sensor.

5. A lighting device comprising:
the light-emitting device according to claims 1; and
a housing.

6. A light-emitting device comprising:
a first light-emitting element comprising:
a first lower electrode;
a first transparent conductive layer over the first lower electrode;
a first hole-injection layer over the first transparent conductive layer;
a first hole-transport layer over the first hole-injection layer;
a first light-emitting layer over the first hole-transport layer;
a first electron-transport layer over the first light-emitting layer;
a charge-generation layer over the first electron-transport layer;
a second light-emitting layer over the charge-generation layer; and
an upper electrode over the second light-emitting layer,
a second light-emitting element comprising:
a second lower electrode;
a second transparent conductive layer over the second lower electrode;
the first hole-injection layer over the second transparent conductive layer;
the first hole-transport layer over the first hole-injection layer;

the first light-emitting layer over the first hole-transport layer;
the first electron-transport layer over the first light-emitting layer;
the charge-generation layer over the first electron-transport layer;
the second light-emitting layer over the charge-generation layer; and
the upper electrode over the second light-emitting layer,
a third light-emitting element comprising:
a third lower electrode;
a third transparent conductive layer over the third lower electrode;
the first hole-injection layer over the third transparent conductive layer;
the first hole-transport layer over the hole-injection layer;
the first light-emitting layer over the first hole-transport layer;
the first electron-transport layer over the first light-emitting layer;
the charge-generation layer over the first electron-transport layer;
the second light-emitting layer over the charge-generation layer; and
the upper electrode over the second light-emitting layer, and
a fourth light-emitting element comprising:
a fourth lower electrode;
a fourth transparent conductive layer over the fourth lower electrode;
the first hole-injection layer over the fourth transparent conductive layer;
the first hole-transport layer over the first hole-injection layer;
the first light-emitting layer over the first hole-transport layer;
the first electron-transport layer over the first light-emitting layer;
the charge-generation layer over the first electron-transport layer;
the second light-emitting layer over the charge-generation layer; and
the upper electrode over the second light-emitting layer,
wherein light emitted from the first light-emitting element has at least one peak in a wavelength range of greater than or equal to 400 nm and less than 480 nm,
wherein light emitted from the second light-emitting element has at least one peak in a wavelength range of greater than or equal to 550 nm and less than 600 nm,
wherein light emitted from the third light-emitting element has at least one peak in a wavelength range of greater than or equal to 600 nm and less than or equal to 740 nm, and
wherein light emitted from the fourth light-emitting element has at least one peak in a wavelength range of greater than or equal to 480 nm and less than 550 nm.

7. The light-emitting device according to claim 6, further comprising:
each of the first light-emitting element, the second light-emitting element, the third light-emitting element, and the fourth light-emitting element comprising:
a second hole-injection layer between the charge-generation layer and the second light-emitting layer;
a second hole-transport layer between second hole-injection layer and the second light-emitting layer; and
a second electron-transport layer between the second light-emitting layer and the upper electrode.

8. The light-emitting device according to claim 6, wherein the first lower electrode, the second lower electrode, the third lower electrode, and the fourth lower electrode each comprise silver.

9. The light-emitting device according to claim 6,
wherein the first light-emitting layer includes a phosphorescent material, and
wherein the second light-emitting layer includes a fluorescent material.

10. An electronic device comprising:
the light-emitting device according to claim 6; and
a housing or a touch sensor.

11. A lighting device comprising:
the light-emitting device according to claims 6; and
a housing.

12. A light-emitting device comprising:
a first light-emitting element comprising:
a first lower electrode;
a first transparent conductive layer over the first lower electrode;
a first light-emitting layer over the first transparent conductive layer;
a charge-generation layer over the first light-emitting layer;
a hole-injection layer over the charge-generation layer;
a hole-transport layer over the hole-injection layer;
a second light-emitting layer over the hole-transport layer;
an electron-transport layer over second light-emitting layer; and
an upper electrode over the second light-emitting layer,
a second light-emitting element comprising:
a second lower electrode;
a second transparent conductive layer over the second lower electrode;
the first light-emitting layer over the second transparent conductive layer;
the charge-generation layer over the first light-emitting layer;
the hole-injection layer over the charge-generation layer;
the hole-transport layer over the hole-injection layer;
the second light-emitting layer over the hole-transport layer;
the electron-transport layer over second light-emitting layer; and
the upper electrode over the second light-emitting layer,
a third light-emitting element comprising:
a third lower electrode;
a third transparent conductive layer over the third lower electrode;
the first light-emitting layer over the third transparent conductive layer;
the charge-generation layer over the first light-emitting layer;
the hole-injection layer over the charge-generation layer;
the hole-transport layer over the hole-injection layer;
the second light-emitting layer over the hole-transport layer;

the electron-transport layer over second light-emitting layer; and the upper electrode over the second light-emitting layer, and a fourth light-emitting element comprising:
  a fourth lower electrode;
  a fourth transparent conductive layer over the fourth lower electrode;
  the first light-emitting layer over the fourth transparent conductive layer;
  the charge-generation layer over the first light-emitting layer;
  the hole-injection layer over the charge-generation layer;
  the hole-transport layer over the hole-injection layer;
  the second light-emitting layer over the hole-transport layer;
  the electron-transport layer over second light-emitting layer; and
  the upper electrode over the second light-emitting layer, wherein light emitted from the first light-emitting element has at least one peak in a wavelength range of greater than or equal to 400 nm and less than 480 nm, wherein light emitted from the second light-emitting element has at least one peak in a wavelength range of greater than or equal to 550 nm and less than 600 nm, wherein light emitted from the third light-emitting element has at least one peak in a wavelength range of greater than or equal to 600 nm and less than or equal to 740 nm, and wherein light emitted from the fourth light-emitting element has at least one peak in a wavelength range of greater than or equal to 480 nm and less than 550 nm.

13. The light-emitting device according to claim 12, wherein the first lower electrode, the second lower electrode, the third lower electrode, and the fourth lower electrode each comprise silver.

14. The light-emitting device according to claim 12,
wherein the first light-emitting layer includes a phosphorescent material, and
wherein the second light-emitting layer includes a fluorescent material.

15. An electronic device comprising:
the light-emitting device according to claim 12; and
a housing or a touch sensor.

16. A lighting device comprising:
the light-emitting device according to claims 12; and
a housing.

* * * * *